US007880495B2

(12) United States Patent
Kunimori et al.

(10) Patent No.: US 7,880,495 B2
(45) Date of Patent: Feb. 1, 2011

(54) DISPLAY DEVICE AND TEST PROBE FOR TESTING DISPLAY DEVICE

(75) Inventors: Takashi Kunimori, Tottori (JP); Yasushi Yamazaki, Azumino (JP); Hajime Nakao, Azumino (JP)

(73) Assignee: Sony Corporation, Tokyo (JP)

( * ) Notice: Subject to any disclaimer, the term of this patent is extended or adjusted under 35 U.S.C. 154(b) by 5 days.

(21) Appl. No.: 12/503,921

(22) Filed: Jul. 16, 2009

(65) Prior Publication Data

US 2010/0052713 A1 Mar. 4, 2010

(30) Foreign Application Priority Data

Aug. 26, 2008 (JP) ............................ 2008-216271

(51) Int. Cl.
*G01R 31/00* (2006.01)

(52) U.S. Cl. ........................ 324/770; 349/149; 349/152

(58) Field of Classification Search ....................... None
See application file for complete search history.

(56) References Cited

U.S. PATENT DOCUMENTS

| | | | | |
|---|---|---|---|---|
| 7,768,291 | B2 * | 8/2010 | Yanagisawa et al. | ........ 324/770 |
| 2006/0170447 | A1 | 8/2006 | Maeda et al. | |
| 2008/0001885 | A1 | 1/2008 | Yanagisawa et al. | |

FOREIGN PATENT DOCUMENTS

| | | |
|---|---|---|
| JP | 2000-122575 | 4/2000 |
| JP | 2002-131719 | 5/2002 |
| JP | 2006-243706 | 9/2006 |
| JP | 2008-009246 | 1/2008 |

* cited by examiner

*Primary Examiner*—Minh N Tang
(74) *Attorney, Agent, or Firm*—K&L Gates LLP

(57) ABSTRACT

A display device is provided with a light detection unit that detects the intensity of ambient light and is capable of automatically controlling the luminosity of an illumination unit and/or the luminosity of the display device on the basis of the intensity of ambient light detected by the light detection unit. Moreover, the display device makes it possible to easily conduct a test on light-sensor characteristics.

11 Claims, 10 Drawing Sheets

10A

LS

70

DISPLAY DEVICE AND TEST PROBE FOR TESTING DISPLAY DEVICE

BACKGROUND

1. Technical Field

The present invention generally relates to a display device and a test probe for testing the display device. More particularly, the invention relates to a display device that is provided with a light detection unit that detects the intensity of ambient light and is capable of automatically controlling the luminosity of an illumination unit and/or the luminosity of the display device on the basis of the intensity of ambient light detected by the light detection unit. Moreover, the display device to which the invention is directed makes it possible to easily conduct a test on light-sensor characteristics. The invention further relates to a test probe for testing such a display device.

2. Related Art

These days, various kinds of display devices such as a liquid crystal display device, an organic electroluminescence (EL) display device, a plasma display device, and the like are widely used. In some cases, an image displayed by a display device is difficult to view depending on the luminous intensity level of external light (i.e., ambient light). As a means for providing a solution to such a problem, it is known in the art to provide a light detection unit such as a light sensor as a component of a display device. For example, when a light sensor is provided in a liquid crystal display panel, the luminosity of a backlight, a sidelight, a front light, or the like is controlled depending on the detection output of the light sensor. When a light sensor is provided in other display devices, the light emission brightness level of a display image is controlled depending on the detection output of the light sensor.

As an example of such a sensor-based control technique, an invention of a liquid crystal display device that automatically turns a backlight or the like ON/OFF depending on ambient luminosity conditions is described in JP-A-2002-131719. Specifically, in the configuration of a liquid crystal display device described in JP-A-2002-131719, a light sensor that is made up of thin film transistors (TFT), which might be hereafter referred to as “TFT light sensor”, is formed over a substrate of a liquid crystal display panel. The liquid crystal display device described in JP-A-2002-131719 detects the optical leakage current of the TFT light sensor so as to automatically turn the backlight into an ON/OFF state depending on ambient luminosity conditions. As another example of such a sensor-based control technique, an invention of a liquid crystal display device that is provided with a TFT light sensor for external light illumination detection and a TFT light sensor for backlight illumination detection, both of which are formed over a substrate of a liquid crystal display panel, is described in JP-A-2000-122575. The liquid crystal display device described in JP-A-2000-122575 controls a backlight or the like on the basis of the detection result of both TFT light sensors. The liquid crystal display device described in JP-A-2002-131719 or JP-A-2000-122575 is capable of automatically controlling the luminosity of a backlight or the like depending on the luminosity of external light on the basis of the output of the TFT light sensor/sensors. Therefore, it is possible for a user to visually observe a display image without any difficulty even when the luminosity of external light changes.

In the configuration of a display device of the related art, a light sensor is provided at, for example, a peripheral area that surrounds a display area of the display device. A wiring pattern is formed at the peripheral area for providing electric connection to the light sensor. The light-sensor connection lines, which are formed at the peripheral area for providing electric connection to the light sensor, are routed at an area that is not the same as an area at which driving lines are formed for, for example, driving liquid crystal or for other display driving operation because input/output signals that are sent over the lines that are formed for providing electric connection to the light sensor are completely different from input/output signals that are sent over the lines that are formed for driving operation. Although the lines that are formed for providing electric connection to the light sensor are routed at an area different from an area at which the lines for driving operation are formed, it is necessary to conduct an in-process wiring test not only for the lines that are formed for driving operation but also for the lines that are formed for providing electric connection to the light sensor because there is a possibility of a wiring defect such as a broken wire, a short circuit with other adjacent line, and the like.

An invention of a display device that has a function of detecting a possible wiring defect in lines that are formed for driving operation, lines that are formed for providing electric connection to a light sensor, and the like is described in JP-A-2008-9246. A display device that is described in JP-A-2008-9246 is provided with at least one switching element that provides electric connection between at least one of a plurality of signal lines and at least one photo sensor element. A video voltage is applied to a plurality of pixels through the signal lines. The switching element is turned ON at the time of testing. By this means, a test is conducted to detect any defect in the photo sensor element and photo sensor wiring depending on the lighting state of a display panel at the time when a predetermined testing voltage is applied to the photo sensor element via the photo sensor wiring. On the other hand, the switching element is turned OFF at the time of normal use so as to make the pixels and the photo sensor independent of each other.

The display device that is disclosed in JP-A-2008-9246 explained above offers an advantageous effect in that it is possible to conduct an in-process test to detect a possible display defect in the display panel and a possible sensor defect in the photo sensor separately. However, generally speaking, defects in a display panel and a light sensor includes, in addition to a short circuit defect that causes low resistance, a short circuit at a high resistance of a few tens of kilo ohms (kΩ) or greater (hereafter may be referred to as “high resistance short”). In this respect, the display device that is disclosed in JP-A-2008-9246 explained above has the following problem that remains to be solved. Since the voltage of the signal line hardly changes in a case where there is a high resistance short of a few tens of kilo ohms or greater between the electrodes of the light sensor, it is difficult to detect a defect in the light-sensing element on the basis of the differences in the lighting condition of the pixels. That is, the display device that is disclosed in JP-A-2008-9246 explained above makes it possible to detect a low resistance short only.

In order to detect a high resistance short of a light sensor, it is necessary to develop a method that makes it possible to detect a very small value of an electric current that flows between testing terminals. In addition, it is demanded to develop a testing scheme that makes it possible to conduct both a lighting test and a light-sensor test without changing a conventionally used test probe and conventionally used test facilities. An example of a conventional means for testing a display device with the use of a test probe easily is described in JP-A-2006-243706.

SUMMARY

An advantage of some aspects of the invention is to provide a display device including a light sensor that makes it possible to conduct a test to easily detect not only a lighting defect in the display device and a low resistance short defect but also a high resistance short defect in the light sensor. The invention further provides, as an aspect thereof, a test probe for testing the display device having these features.

In order to address the above-identified problems without any limitation thereto, a display device according to a first aspect of the invention includes: a substrate; a plurality of signal lines and a plurality of scanning lines that intersect with each other over the substrate; a common line that is provided over the substrate; a plurality of display pixels that is arrayed in a matrix layout over the substrate, each of the plurality of display pixels including a thin film transistor (TFT) and a pixel electrode, the thin film transistor being provided in the neighborhood of an intersection of the signal line and the scanning line, the thin film transistor functioning as a switching element, the pixel electrode being electrically connected to the thin film transistor; a light sensor element that is provided over the substrate, the light sensor element being made of a thin film transistor that detects the amount of light; an electrostatic protection element that is provided over the substrate, the electrostatic protection element being made of a thin film transistor that protects the light sensor element so that the light sensor element is not damaged by static electricity; a plurality of testing terminals that is connected to the plurality of signal lines, the plurality of scanning lines, and the common line at a lead part that leads from the plurality of signal lines, the plurality of scanning lines, and the common line; two light sensor element signal lines that respectively extend from a first electrode of the light sensor element and a second electrode of the light sensor element to the lead part, one light sensor element signal line being connected to a testing terminal other than the plurality of testing terminals, the other light sensor element signal line being connected to another testing terminal other than the plurality of testing terminals; a light sensor element control line that extends from a control electrode of the light sensor element to the lead part, the light sensor element control line being connected to still another testing terminal other than the plurality of testing terminals; and an electrostatic protection element control line that extends from a control electrode of the electrostatic protection element to the lead part, the electrostatic protection element control line being connected to still another testing terminal other than the plurality of testing terminals, wherein the testing terminals of the light sensor element signal lines are arrayed adjacent to two testing terminals of the plurality of signal lines, respectively, and the testing terminal of the common line, the testing terminal of the light sensor element control line, and the testing terminal of the electrostatic protection element control line are arrayed in an adjacent manner.

In the configuration of a display device according to the first aspect of the invention described above, a plurality of testing terminals is connected to a plurality of signal lines, a plurality of scanning lines, and a common line at a lead part that leads from the plurality of signal lines, the plurality of scanning lines, and the common line. In addition, two light sensor element signal lines respectively extend from a first electrode of a light sensor element and a second electrode of the light sensor element to the lead part. One light sensor element signal line is connected to a testing terminal other than the plurality of testing terminals. The other light sensor element signal line is connected to another testing terminal other than the plurality of testing terminals. A light sensor element control line extends from a control electrode of the light sensor element to the lead part. The light sensor element control line is connected to still another testing terminal other than the plurality of testing terminals. An electrostatic protection element control line extends from a control electrode of an electrostatic protection element to the lead part. The electrostatic protection element control line is connected to still another testing terminal other than the plurality of testing terminals. With such a configuration, the light sensor element and the electrostatic protection element are always set in an OFF state when a cutoff voltage is applied to the testing terminal of the common line. Therefore, the testing terminals of the plurality of signal lines and the common line are not short circuited via the light sensor element or the electrostatic protection element. Thus, a display device according to the first aspect of the invention described above makes it possible to conduct a test for the light sensor and the display device separately.

In addition, in the configuration of a display device according to the first aspect of the invention described above, the testing terminals of the light sensor element signal lines are arrayed adjacent to two testing terminals of the plurality of signal lines, respectively. The testing terminal of the common line, the testing terminal of the light sensor element control line, and the testing terminal of the electrostatic protection element control line are arrayed in an adjacent manner. With such a configuration, it is possible to apply the same testing voltage to the testing terminals of the plurality of signal lines and the testing terminals of the light sensor element signal lines at the time when a test is conducted. In addition, it is possible to apply the same testing voltage to the testing terminal of the common line, the testing terminal of the light sensor element control line, and the testing terminal of the electrostatic protection element control line at the time when a test is conducted. Since the light sensor element and the electrostatic protection element are always set in an OFF state when a cutoff voltage is applied to the testing terminal of the common line, a display device according to the first aspect of the invention described above makes it possible to conduct a test so as to easily detect not only a lighting defect in a display area and a low resistance short defect but also a high resistance short defect in the light sensor element. As explained earlier, a display device of the related art that is described in JP-A-2008-9246 is provided with at least one switching element that provides electric connection between at least one of a plurality of signal lines and at least one photo sensor element. That is, a switching element that connects the light sensor and the signal line is required. In contrast, a display device according to the first aspect of the invention described above makes it possible to conduct a lighting test and a light-sensor test without any necessity to provide such a switching element that connects the light sensor and the signal line.

In the configuration of a display device according to the first aspect of the invention described above, it is preferable that the plurality of signal lines should be arrayed in a predetermined sequential order so as to be capable of displaying different colors; the testing terminals of the plurality of signal lines should be separately arrayed so as to form a plurality of array lines each of which corresponds to a color among the different colors of the plurality of signal lines; the testing terminals of the light sensor element signal lines that respectively extend from the first electrode of the light sensor element and the second electrode of the light sensor element should be provided on two array lines different from each other in such a manner that each of the testing terminals of the light sensor element signal lines lies on an extension of one of the plurality of array lines; and the testing terminal of the common line, the testing terminal of the light sensor element control line, and the testing terminal of the electrostatic protection element control line should be arrayed on the same line. A display device having the preferred configuration described above may be hereafter referred to as "the first preferred display device".

The first preferred display device offers the same advantageous effects as those of a display device according to the first aspect of the invention described above. Moreover, with such a preferred configuration, the first preferred display device makes it possible to conduct a display lighting test and a low resistance short test for each color.

In the configuration of a display device according to the first aspect of the invention described above or the first preferred display device described above, it is preferable that the plurality of scanning lines should be divided into four groups, which are a first scanning line group, a second scanning line group, a third scanning line group, and a fourth scanning line group; the plurality of scanning lines should extend to the lead part for each of the first scanning line group, the second scanning line group, the third scanning line group, and the fourth scanning line group; and the testing terminals connected respectively to the plurality of scanning lines should be separately arrayed near one another so as to correspond to the first scanning line group, the second scanning line group, the third scanning line group, and the fourth scanning line group. A display device having the preferred configuration described above may be hereafter referred to as "the second preferred display device".

The second preferred display device offers the same advantageous effects as those of a display device according to the first aspect of the invention described above. Moreover, with such a preferred configuration, the second preferred display device makes it possible to conduct a display lighting test and a low resistance short test for each of four scanning line groups.

It is preferable that the second preferred display device should further include a first switching element and a second switching element each of which is provided in the lead part, wherein the light sensor element control line is connected to a first electrode of the first switching element; the electrostatic protection element control line is connected to a first electrode of the second switching element; a testing terminal is connected to a second electrode of the first switching element; another testing terminal is connected to a second electrode of the second switching element; still another testing terminal is connected to a control electrode of the first switching element; still another testing terminal is connected to a control electrode of the second switching element; the testing terminals of the light sensor element signal lines are arrayed adjacent to two testing terminals of the plurality of signal lines, respectively; and the testing terminals that are connected to the second electrodes of the first switching element and the second switching element and to the control electrodes of the first switching element and the second switching element are arrayed separately in such a manner that each of the testing terminals that are connected to the second electrodes of the first switching element and the second switching element and to the control electrodes of the first switching element and the second switching element is provided adjacent to an array of the testing terminals of the corresponding one of the first scanning line group, the second scanning line group, the third scanning line group, and the fourth scanning line group. A display device having the preferred configuration described above may be hereafter referred to as "the third preferred display device".

In such a preferred configuration of the third preferred display device, it is possible to switch the first switching element and the second switching element into an ON/OFF state by varying a voltage that is applied to each of four scanning line groups. When the first switching element and the second switching element are set in an ON state, the control electrode of the light sensor element and the control electrode of the electrostatic protection element are electrically connected to any of four scanning line groups. Therefore, it is possible to conduct a low resistance short test and a lighting test of the display device. The third preferred display device offers the same advantageous effects as those of the second preferred display device described above. Moreover, with such a preferred configuration, the third preferred display device makes it possible to detect a short circuit between the control electrode of the light sensor element and the common line as well as a short circuit between the control electrode of the electrostatic protection element and the common line.

It is preferable that the second preferred display device should further include a first switching element, a second switching element, a third switching element, and a fourth switching element each of which is provided in the lead part, wherein the light sensor element control line is connected to a first electrode of the first switching element and to a first electrode of the third switching element; the electrostatic protection element control line is connected to a first electrode of the second switching element and to a first electrode of the fourth switching element; a testing terminal is connected to a second electrode of the first switching element; another testing terminal is connected to a second electrode of the second switching element; still another testing terminal is connected to a second electrode of the third switching element; still another testing terminal is connected to a second electrode of the fourth switching element; shared testing terminals are connected to control electrodes of the first switching element, the second switching element, the third switching element, and the fourth switching element; the testing terminals of the light sensor element signal lines are arrayed adjacent to two testing terminals of the plurality of signal lines, respectively; any two terminals among the testing terminals that are connected to the second electrodes of the first switching element, the second switching element, the third switching element, and the fourth switching element are arrayed adjacent to the testing terminal of the common line; and the remaining two terminals among the testing terminals that are connected to the second electrodes of the first switching element, the second switching element, the third switching element, and the fourth switching element as well as the shared testing terminals that are connected to the control electrodes of the first switching element, the second switching element, the third switching element, and the fourth switching element are arrayed separately in such a manner that each one of the remaining two and shared terminals mentioned above is provided adjacent to an array of the testing terminals of the corresponding one of the first scanning line group, the second scanning line group, the third scanning line group, and the fourth scanning line group. A display device having the preferred configuration described above may be hereafter referred to as "the fourth preferred display device".

In such a preferred configuration of the fourth preferred display device, when all of the first switching element, the second switching element, the third switching element, and the fourth switching element are set in an OFF state, the control electrode of the light sensor element and the control electrode of the electrostatic protection element are set in a floating state. Therefore, it is possible to conduct a low resistance short test and a lighting test of the display device. Moreover, when the first switching element and the third switching element are set in an OFF state, the control electrode of the light sensor element is set in a floating state. Therefore, it is possible to detect a high resistance short of the light sensor element. Furthermore, when the second switching element and the fourth switching element are set in an OFF state, the control electrode of the electrostatic protection element is set in a floating state. Therefore, it is possible to detect a high resistance short of the electrostatic protection element.

As a second aspect thereof, a test probe for testing a display device according to the first aspect of the invention described above is provided. The test probe according to the second aspect of the invention includes: a scanning-line wiring part that extends in a direction intersecting with the leading direction of the lead part formed over the substrate, the scanning-line wiring part extending so as to correspond to the array layout of the testing terminals of the plurality of scanning lines, the scanning-line wiring part being brought into contact with the testing terminals of the plurality of scanning lines when the test probe is brought into contact with the testing terminals of the display device; a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

As a third aspect thereof, a test probe for testing the first preferred display device is provided. The test probe according to the third aspect of the invention includes: a scanning-line wiring part that extends in a direction intersecting with the leading direction of the lead part formed over the substrate, the scanning-line wiring part extending so as to correspond to the array layout of the testing terminals of the plurality of scanning lines, the scanning-line wiring part being brought into contact with the testing terminals of the plurality of scanning lines when the test probe is brought into contact with the testing terminals of the display device; a first signal-line wiring part that extends in the direction intersecting with the leading direction of the lead part formed over the substrate, the first signal-line wiring part extending so as to correspond to one of the plurality of array lines of the testing terminals of the plurality of signal lines and one of the testing terminals of the light sensor element signal lines, the first signal-line wiring part being brought into contact with the one of the plurality of array lines of the testing terminals of the plurality of signal lines and the one of the testing terminals of the light sensor element signal lines when the test probe is brought into contact with the testing terminals of the display device; a second signal-line wiring part that extends in the direction intersecting with the leading direction of the lead part formed over the substrate, the second signal-line wiring part extending so as to correspond to another one of the plurality of array lines of the testing terminals of the plurality of signal lines and the other of the testing terminals of the light sensor element signal lines, the second signal-line wiring part being brought into contact with the another one of the plurality of array lines of the testing terminals of the plurality of signal lines and the other of the testing terminals of the light sensor element signal lines when the test probe is brought into contact with the testing terminals of the display device; a third signal-line wiring part that extends in the direction intersecting with the leading direction of the lead part formed over the substrate, the third signal-line wiring part extending so as to correspond to the other or the others of the plurality of array lines of the testing terminals of the plurality of signal lines, the third signal-line wiring part being brought into contact with the other or the others of the plurality of array lines of the testing terminals of the plurality of signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

As a fourth aspect thereof, a test probe for testing the second preferred display device is provided. The test probe according to the fourth aspect of the invention includes: a scanning-line wiring part that extends in a direction intersecting with the leading direction of the lead part formed over the substrate, the scanning-line wiring part extending so as to correspond to the separate array layout of the testing terminals of the plurality of scanning lines divided into the first scanning line group, the second scanning line group, the third scanning line group, and the fourth scanning line group, the scanning-line wiring part being brought into contact with the testing terminals of the plurality of scanning lines divided into the first scanning line group, the second scanning line group, the third scanning line group, and the fourth scanning line group when the test probe is brought into contact with the testing terminals of the display device; a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

As a fifth aspect thereof, a test probe for testing the third preferred display device is provided. The test probe according to the fifth aspect of the invention includes: a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device; a second scanning-line wiring part that extends in a direction intersecting with the leading direction of the lead part formed over the substrate, the second scanning-line wiring part extending so as to correspond to the array layout of the testing terminals of the second scanning line group and the testing terminal of the second electrode of the second switching element, the second scanning-line wiring part being brought into contact with the testing terminals of the second scanning line group and the testing terminal of the second electrode of the second switching element when the test probe is brought into contact with the testing terminals of the display device; a third scanning-line wiring part that extends in a direction intersecting with the leading direction of the lead part formed over the substrate, the third scanning-line wiring part extending so as to correspond to the array layout of the testing terminals of the third scanning line group and the testing terminal of the control electrode of the first switching element, the third scanning-line wiring part being brought into contact with the testing terminals of the third scanning line group and the testing terminal of the control electrode of the first switching element when the test probe is brought into contact with the testing terminals of the display device; a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the control electrode of the second switching element, the fourth scanning-line wiring part being brought into contact with the testing terminals of the fourth scanning line group and the testing terminal of the control electrode of the second switching element when the test probe is brought into contact with the testing terminals of the display device; a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the common-line wiring part being brought into contact with the testing terminal of the common line when the test probe is brought into contact with the testing terminals of the display device.

As a sixth aspect thereof, a test probe for testing the fourth preferred display device is provided. The test probe according to the sixth aspect of the invention includes: a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device; a second scanning-line wiring part that extends in a direction intersecting with the leading direction of the lead part formed over the substrate, the second scanning-line wiring part extending so as to correspond to the array layout of the testing terminals of the second scanning line group as well as the testing terminal of the control electrode of the second switching element and the testing terminal of the control electrode of the third switching element, the second scanning-line wiring part being brought into contact with the testing terminals of the second scanning line group as well as the testing terminal of the control electrode of the second switching element and the testing terminal of the control electrode of the third switching element when the test probe is brought into contact with the testing terminals of the display device; a third scanning-line wiring part that extends in a direction intersecting with the leading direction of the lead part formed over the substrate, the third scanning-line wiring part extending so as to correspond to the array layout of the testing terminals of the third scanning line group as well as the testing terminal of the control electrode of the first switching element and the testing terminal of the control electrode of the fourth switching element, the third scanning-line wiring part being brought into contact with the testing terminals of the third scanning line group as well as the testing terminal of the control electrode of the first switching element and the testing terminal of the control electrode of the fourth switching element when the test probe is brought into contact with the testing terminals of the display device; a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the second electrode of the second switching element, the fourth scanning-line wiring part being brought into contact with the testing terminals of the fourth scanning line group and the testing terminal of the second electrode of the second switching element when the test probe is brought into contact with the testing terminals of the display device; a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the second electrode of the third switching element, and the testing terminal of the second electrode of the fourth switching element, the common-line wiring part being brought into contact with the testing terminal of the common line, the testing terminal of the second electrode of the third switching element, and the testing terminal of the second electrode of the fourth switching element when the test probe is brought into contact with the testing terminals of the display device.

As a seventh aspect thereof, a test probe for testing the second preferred display device, the third preferred display device, or the fourth preferred display device is provided. The test probe according to the seventh aspect of the invention includes: a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device; a second scanning-line wiring part that extends in a direction intersecting with the leading direction of the lead part formed over the substrate, the second scanning-line wiring part extending so as to correspond to the array layout of the testing terminals of the second scanning line group as well as the testing terminal of the control electrode of the second switching element and the testing terminal of the control electrode of the third switching element, the second scanning-line wiring part being brought into contact with the testing terminals of the second scanning line group as well as the testing terminal of the control electrode of the second switching element and the testing terminal of the control electrode of the third switching element when the test probe is brought into contact with the testing terminals of the display device; a third scanning-line wiring part that extends in a direction intersecting with the leading direction of the lead part formed over the substrate, the third scanning-line wiring part extending so as to correspond to the array layout of the testing terminals of the third scanning line group as well as the testing terminal of the control electrode of the first switching element and the testing terminal of the control electrode of the fourth switching element, the third scanning-line wiring part being brought into contact with the testing terminals of the third scanning line group as well as the testing terminal of the control electrode of the first switching element and the testing terminal of the control electrode of the fourth switching element when the test probe is brought into contact with the testing terminals of the display device; a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the second electrode of the second switching element, the fourth scanning-line wiring part being brought into contact with the testing terminals of the fourth scanning line group and the testing terminal of the second electrode of the second switching element when the test probe is brought into contact with the testing terminals of the display device; a first signal-line wiring part that extends in the direction intersecting with the leading direction of the lead part formed over the substrate, the first signal-line wiring part extending so as to correspond to one of the plurality of array lines of the testing terminals of the plurality of signal lines and one of the testing terminals of the light sensor element signal lines, the first signal-line wiring part being brought into contact with the one of the plurality of array lines of the testing terminals of the plurality of signal lines and the one of the testing terminals of the light sensor element signal lines when the test probe is brought into contact with the testing terminals of the display device; a second signal-line wiring part that extends in the direction intersecting with the leading direction of the lead part formed over the substrate, the second signal-line wiring part extending so as to correspond to another one of the plurality of array lines of the testing terminals of the plurality of signal lines and the other of the testing terminals of the light sensor element signal lines, the second signal-line wiring part being brought into contact with the another one of the plurality of array lines of the testing terminals of the plurality of signal lines and the other of the testing terminals of the light sensor element signal lines when the test probe is brought into contact with the testing terminals of the display device; a third signal-line wiring part that extends in the direction intersecting with the leading direction of the lead part formed over the substrate, the third signal-line wiring part extending so as to correspond to the other or the others of the plurality of array lines of the testing terminals of the plurality of signal lines, the third signal-line wiring part being brought into contact with the other or the others of the plurality of array lines of the testing terminals of the plurality of signal lines when the test probe is brought into contact with the testing terminals of the display device; and a common-line wiring part that extends so as to correspond to the array layout of the testing terminal of the common line, the testing terminal of the second electrode of the third switching element, and the testing terminal of the second electrode of the fourth switching element, the common-line wiring part being brought into contact with the testing terminal of the common line, the testing terminal of the second electrode of the third switching element, and the testing terminal of the second electrode of the fourth switching element when the test probe is brought into contact with the testing terminals of the display device.

A test probe according to an aspect of the invention can be used for testing a display device according to an aspect of the invention or a display device having a preferred configuration thereof. Specifically, it is possible to conduct a lighting test of the display device and a low resistance short test thereof as well as a low resistance short test of a light sensor element and an electrostatic protection element and a high resistance short test of the light sensor element and the electrostatic protection element by bringing the test probe into contact with the testing terminals of the display device and then by applying a predetermined voltage to each terminal of the test probe.

BRIEF DESCRIPTION OF THE DRAWINGS

The invention will be described with reference to the accompanying drawings, wherein like numbers reference like elements.

FIG. 1 shows an array substrate of a liquid crystal display device according to the first embodiment of the invention with a color filter substrate of the liquid crystal display device being seen through and thus being omitted from the drawing.

DESCRIPTION OF EXEMPLARY EMBODIMENTS

With reference to the accompanying drawings, exemplary embodiments of the invention, including its best mode, will now be explained in detail. In the following description of each of exemplary embodiments of the invention, a liquid crystal display device is taken as an example of a display device that embodies the technical concept of various aspects of the invention. However, the following description is not intended to limit the scope of the invention. Accordingly, the present invention should be in no case interpreted to be limited to any liquid crystal display device of the specific embodiments described herein. The invention may be modified, altered, changed, adapted, and/or improved within a range not departing from the gist and/or spirit of the invention apprehended by a person skilled in the art from explicit and implicit description given herein, which are deemed as encompassed in the scope of appended claims. It should be noted that, in the accompanying drawings that will be mentioned in the following description of this specification, different scales are used for layers/members illustrated therein so that each of the layers/members has a size that is easily recognizable therein. Therefore, the dimensions of constituent elements that are shown in the accompanying drawings do not necessarily reflect, in proportion thereto, those that will be adopted in an actual implementation of the invention.

Figure 1:
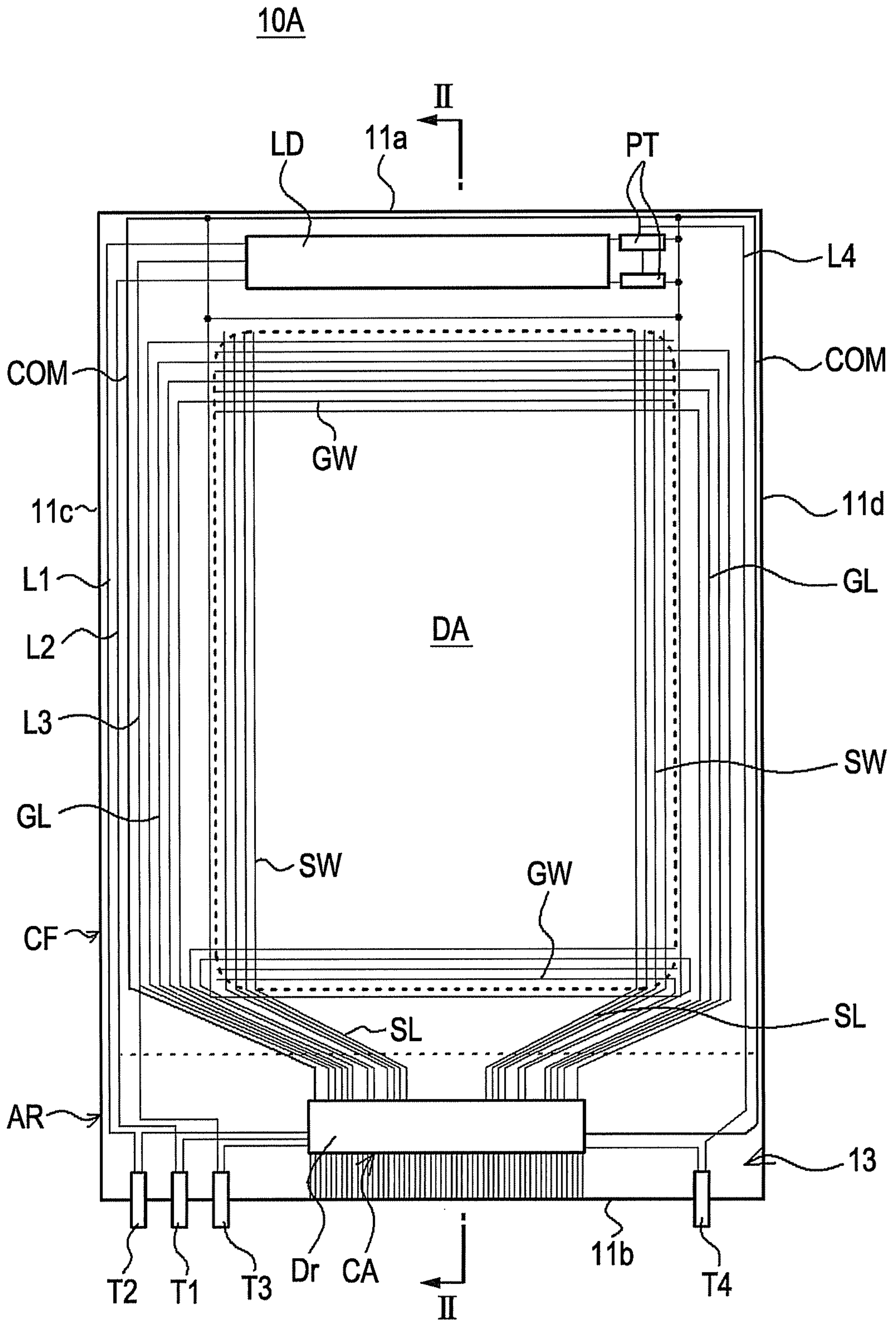
FIG. 1 is a plan view that schematically illustrates an example of the configuration of a liquid crystal display device according to a first embodiment of the invention; more specifically.
Figure 2:
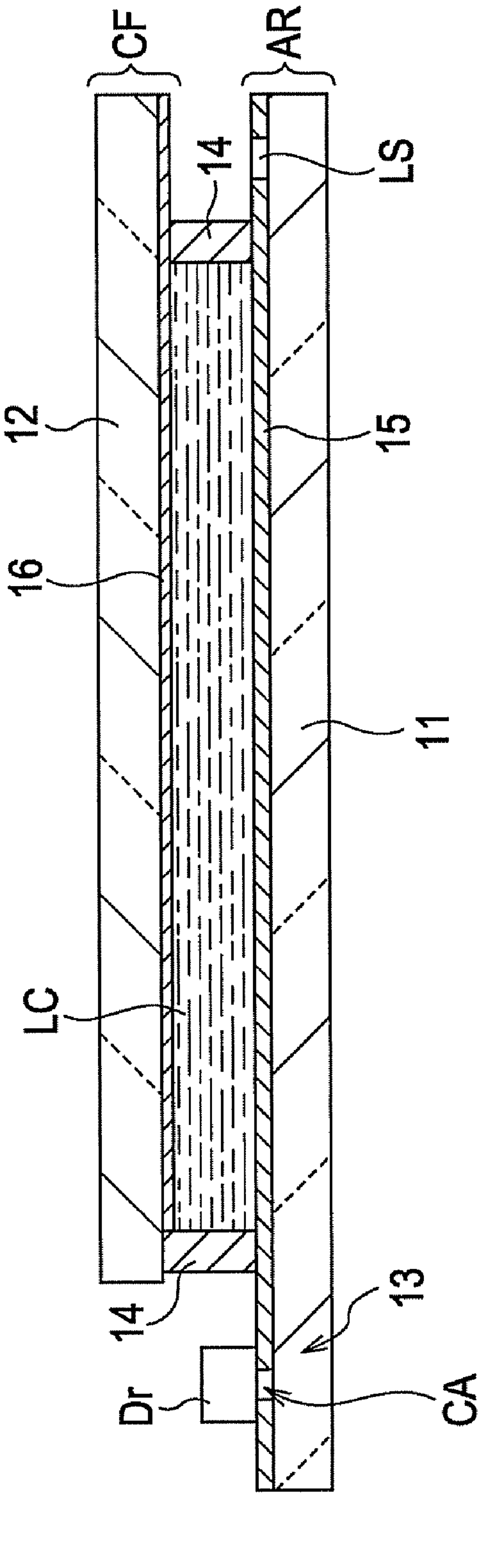
FIG. 2 is a sectional view taken along the line II-II of FIG. 1.
Figure 3:
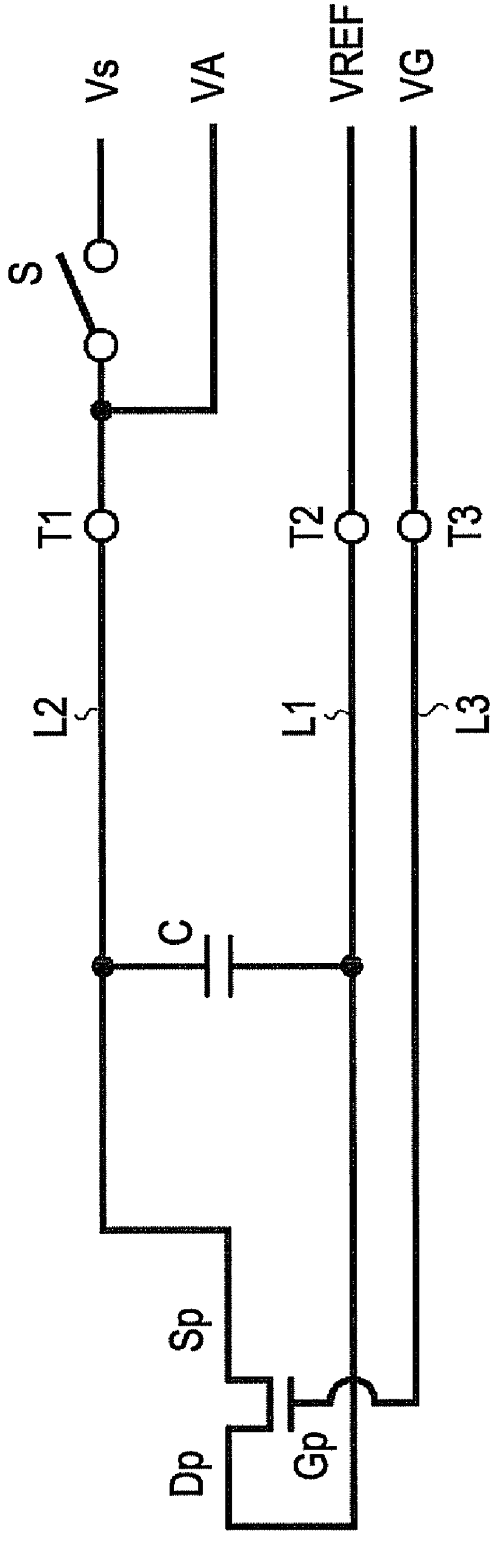
FIG. 3 is an equivalent circuit diagram that schematically illustrates an example of the configuration of a light detection unit according to an exemplary embodiment of the invention.
Figure 4:
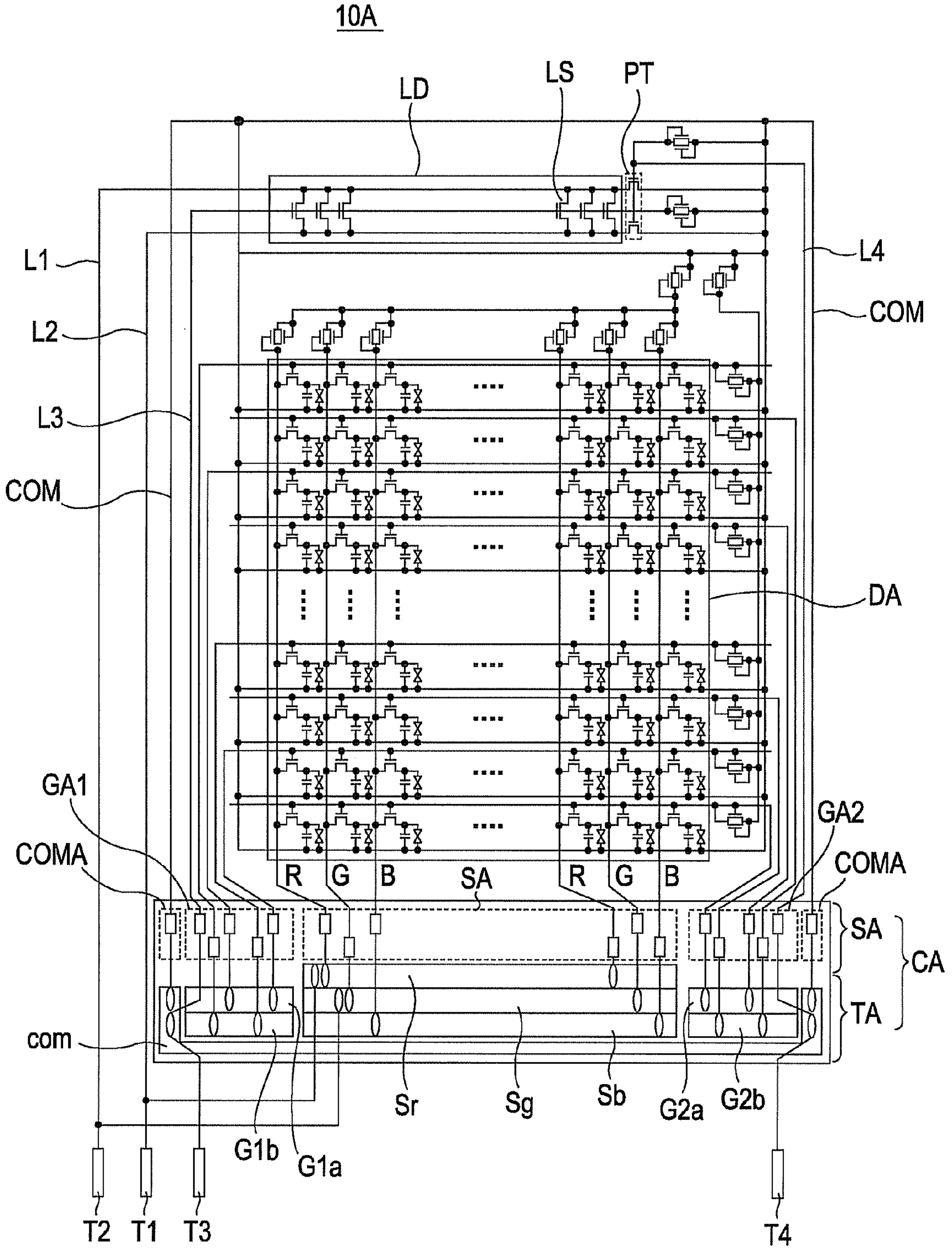
FIG. 4 is an equivalent circuit diagram that schematically illustrates an example of the configuration of a liquid crystal display device according to the first embodiment of the invention.
Figure 5:
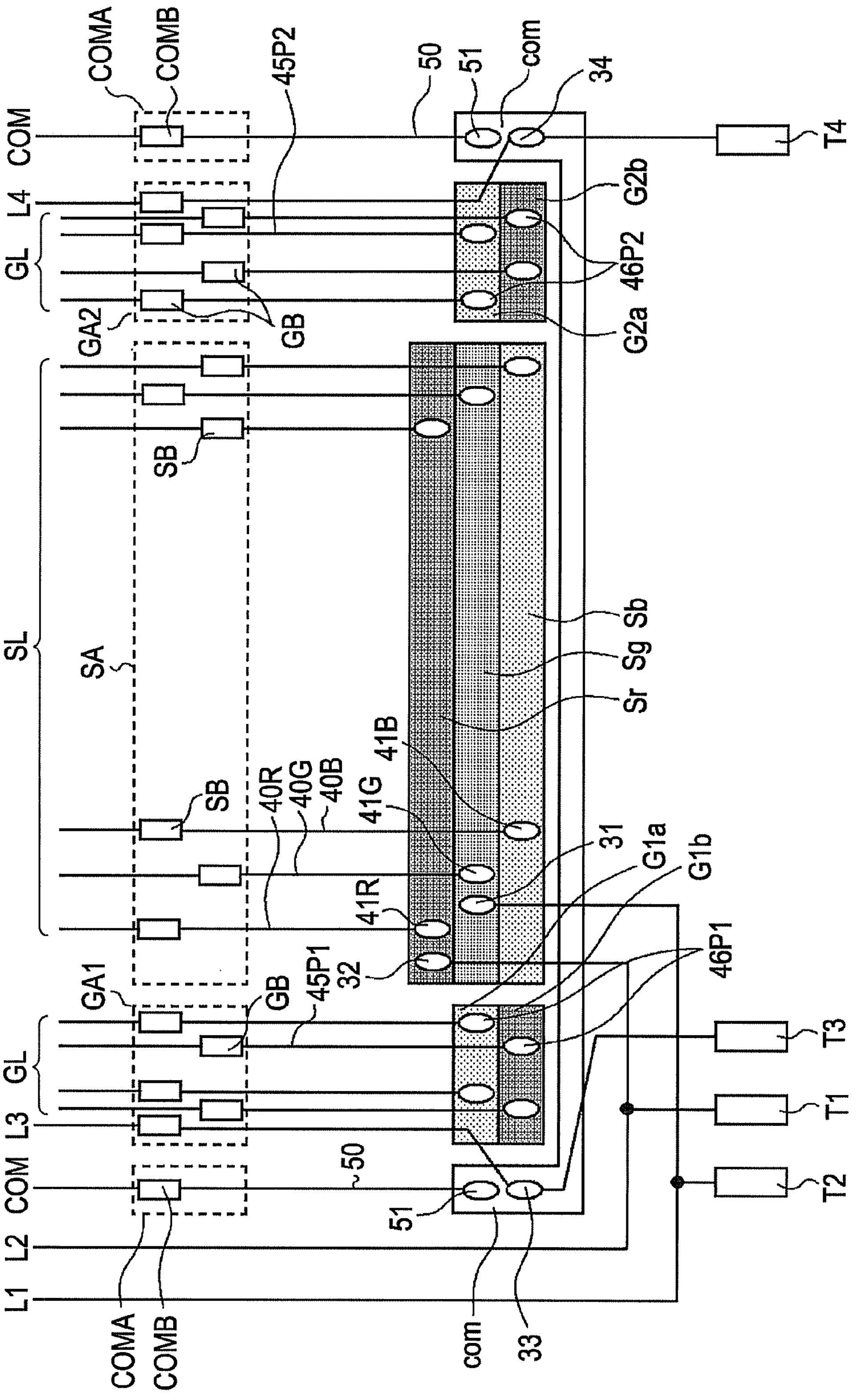
FIG. 5 is an enlarged view that schematically illustrates an example of the configuration of a testing terminal area illustrated in FIG. 4.
Figure 6:
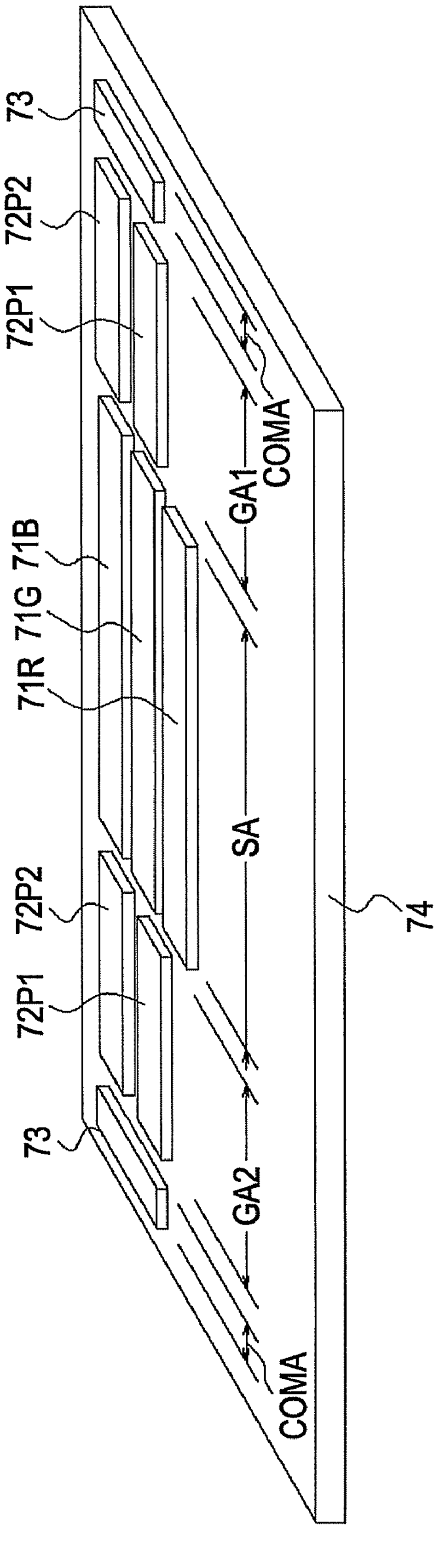
FIG. 6 is a perspective view that schematically illustrates an example of the configuration of a testing tool according to an exemplary embodiment of the invention that is brought into contact with each of testing terminals.
Figure 7:
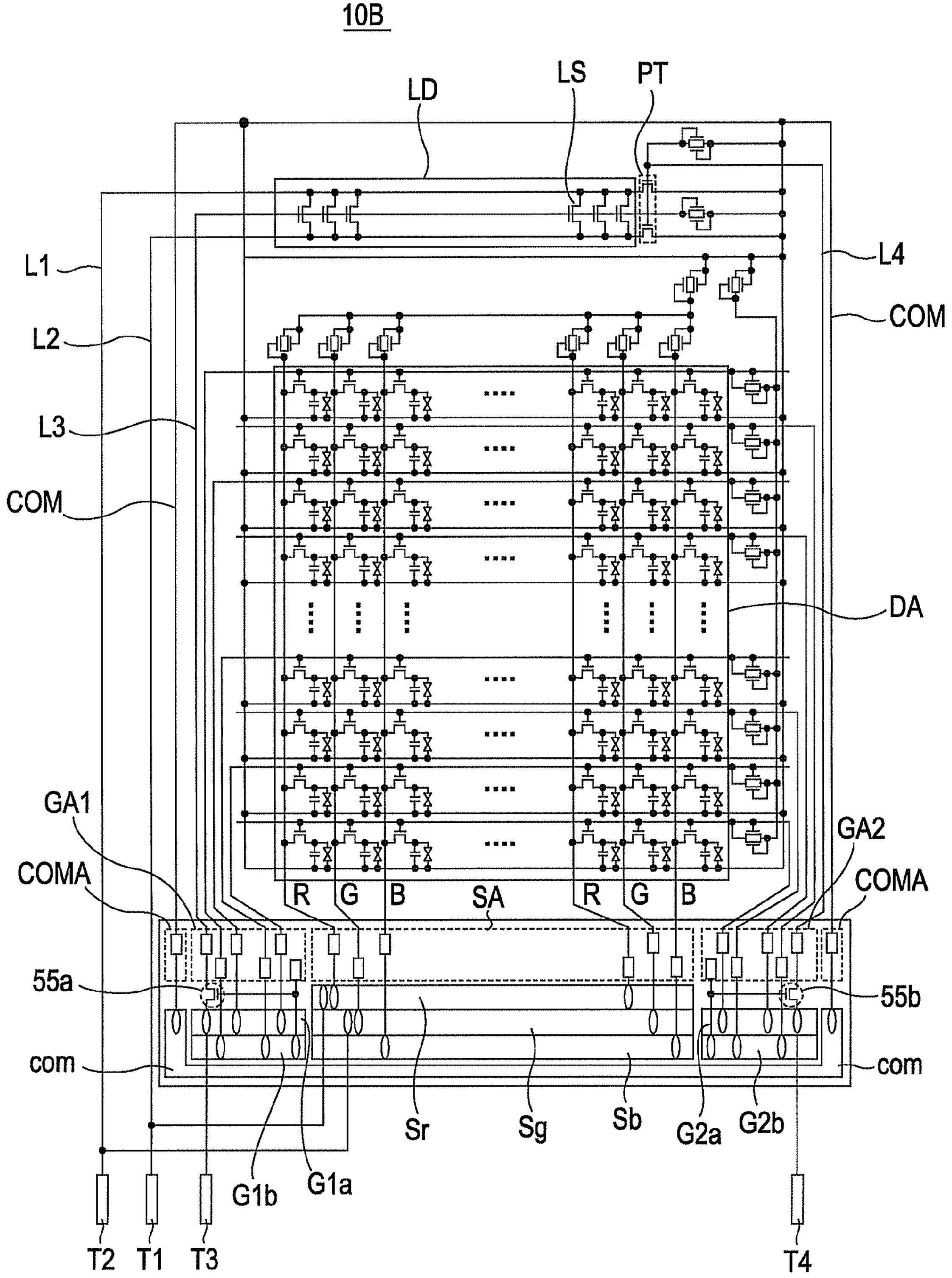
FIG. 7 is an equivalent circuit diagram that schematically illustrates an example of the configuration of a liquid crystal display device according to a second embodiment of the invention.
Figure 8:
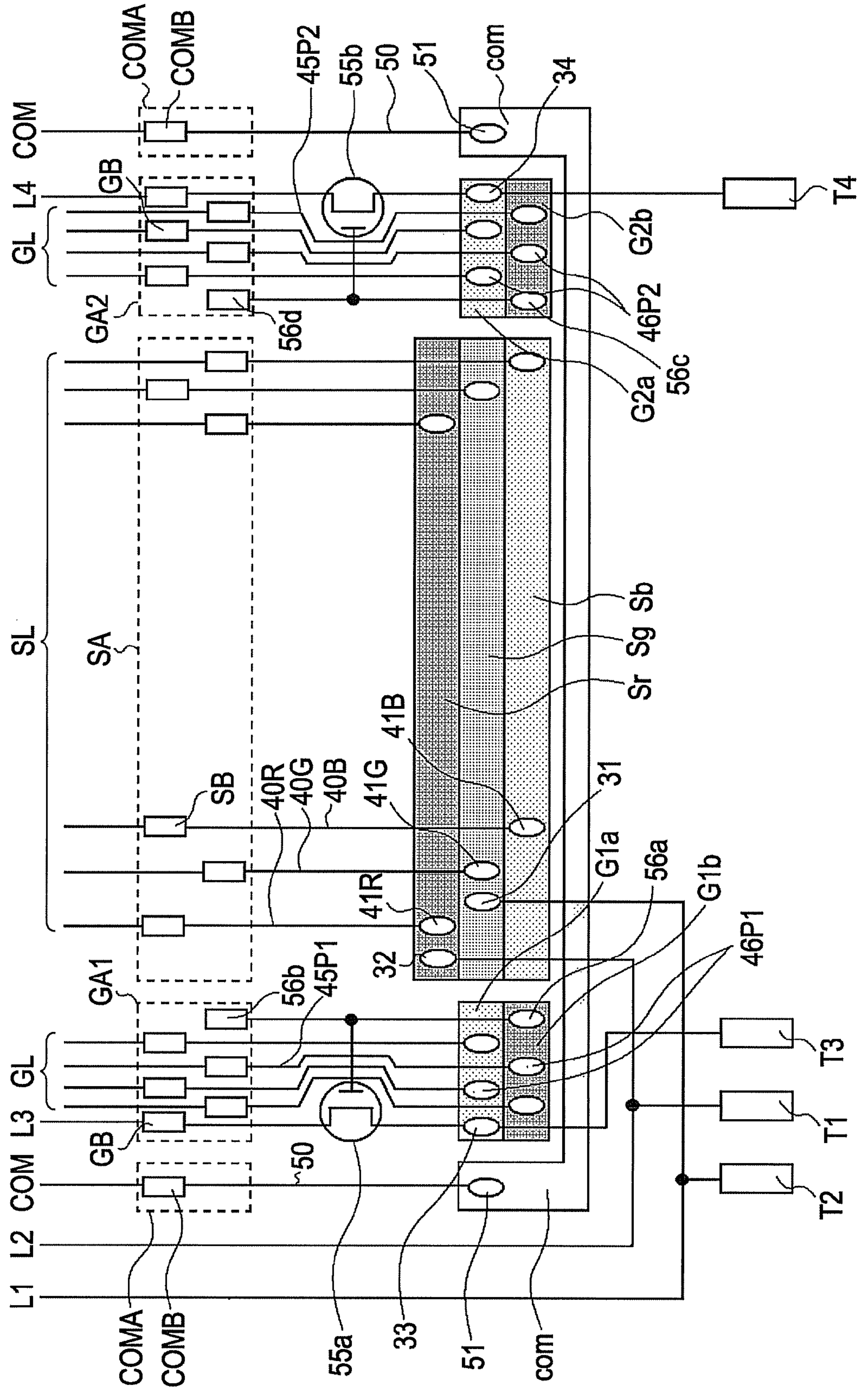
FIG. 8 is an enlarged view that schematically illustrates an example of the configuration of a testing terminal area illustrated in FIG. 7.
Figure 9:
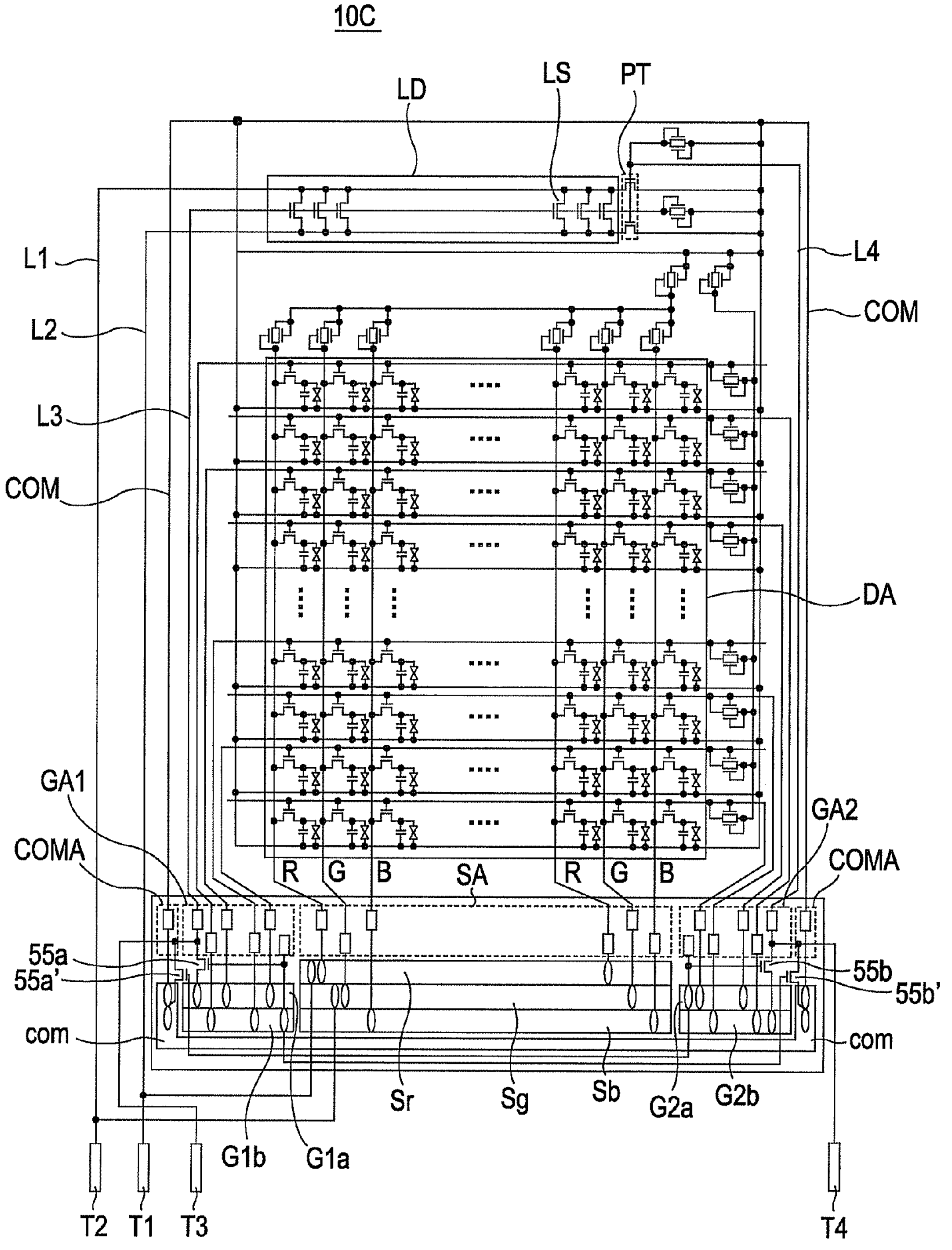
FIG. 9 is an equivalent circuit diagram that schematically illustrates an example of the configuration of a liquid crystal display device according to a third embodiment of the invention.
Figure 10:
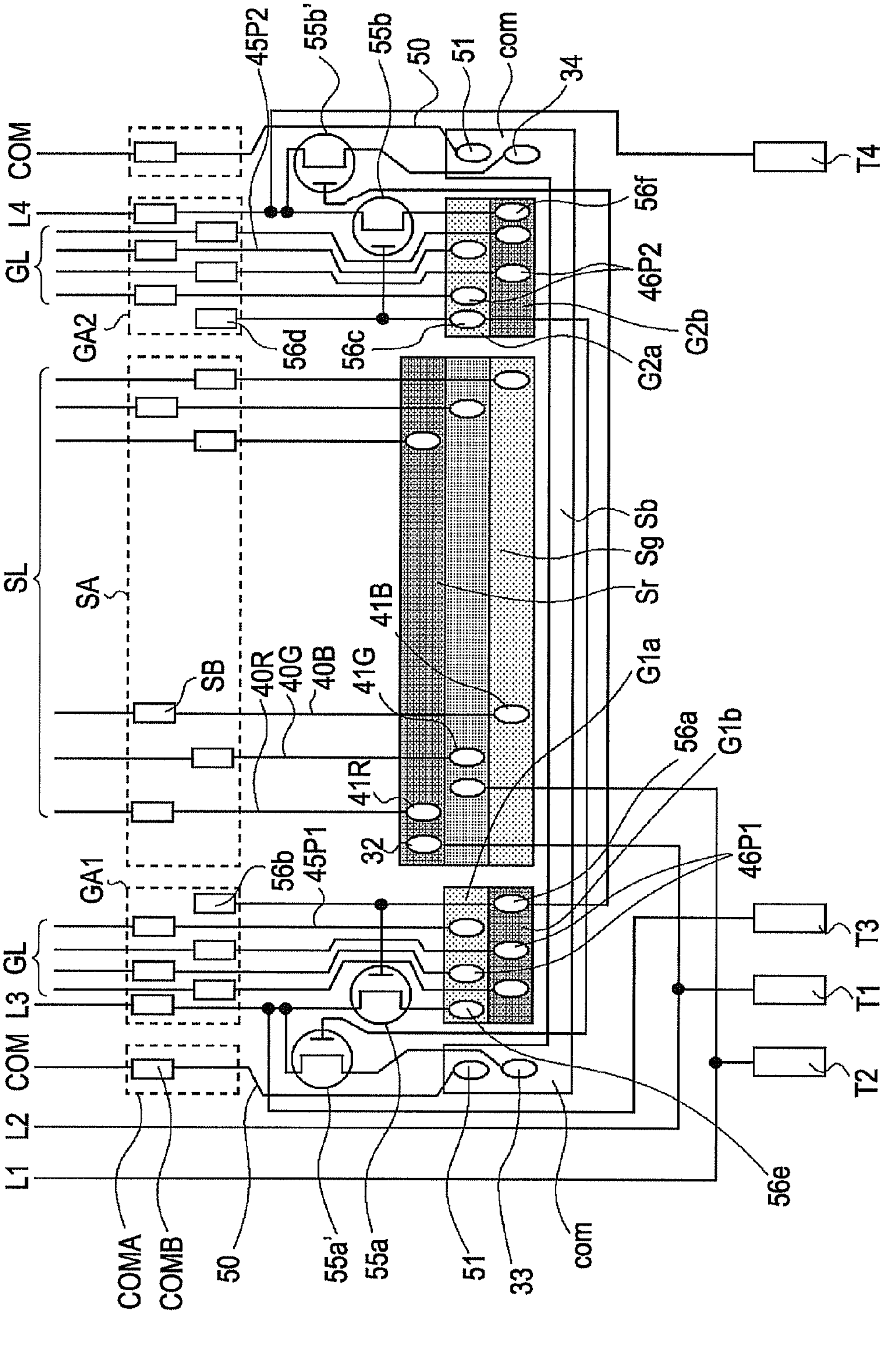
FIG. 10 is an enlarged view that schematically illustrates an example of the configuration of a testing terminal area illustrated in FIG. 9.

FIG. 1 is a plan view that schematically illustrates an example of the configuration of a liquid crystal display device according to a first embodiment of the invention. More specifically, FIG. 1 shows an array substrate of a liquid crystal display device according to the first embodiment of the invention. Note that a color filter substrate of the liquid crystal display device is seen through and thus omitted from the drawing. FIG. 2 is a sectional view taken along the line II-II of FIG. 1. FIG. 3 is an equivalent circuit diagram that schematically illustrates an example of the configuration of a light detection unit according to an exemplary embodiment of the invention. FIG. 4 is an equivalent circuit diagram that schematically illustrates an example of the configuration of a liquid crystal display device according to the first embodiment of the invention. FIG. 5 is an enlarged view that schematically illustrates an example of the configuration of a testing terminal area illustrated in FIG. 4. FIG. 6 is a perspective view that schematically illustrates an example of the configuration of a testing tool according to an exemplary embodiment of the invention that is brought into contact with each of testing terminals. FIG. 7 is an equivalent circuit diagram that schematically illustrates an example of the configuration of a liquid crystal display device according to a second embodiment of the invention. FIG. 8 is an enlarged view that schematically illustrates an example of the configuration of a testing terminal area illustrated in FIG. 7. FIG. 9 is an equivalent circuit diagram that schematically illustrates an example of the configuration of a liquid crystal display device according to a third embodiment of the invention. FIG. 10 is an enlarged view that schematically illustrates an example of the configuration of a testing terminal area illustrated in FIG. 9.

First Embodiment

As illustrated in FIGS. 1 and 2, a liquid crystal display device 10A according to the first embodiment of the invention is provided with an array substrate AR and a color filter substrate CF that are provided opposite to each other. The base substrate of the array substrate AR is made of a transparent insulating material that has a rectangular shape. For example, the array substrate AR has a transparent substrate 11 that is made of a glass plate or the like as its base substrate. Various kinds of wiring, lines, and the like are formed and/or patterned over the transparent substrate 11 so as to make up a part of the array substrate AR. The color filter substrate CF also has a rectangular transparent substrate 12 that is made of a transparent insulating material as its base substrate. Various kinds of wiring, lines, and the like are formed and/or patterned over the transparent substrate 12 so as to make up a part of the color filter substrate CF. The liquid crystal display device 10A is either a light-transmissive type liquid crystal display device or a transflective type liquid crystal display device that is driven in a TN (Twisted Nematic) mode, a VA (Vertical Alignment) mode, or the like. The size of the transparent substrate 11 of the array substrate AR is larger than that of the transparent substrate 12 of the color filter substrate CF so that a protruding part 13 of the transparent substrate 11 that has a predetermined protrusion area size is exposed without being covered by the transparent substrate 12 of the color filter substrate CF when these substrates AR and CF are provided so as to face each other. A sealing material 14 is painted on the peripheral area of the array substrate AR and the peripheral area of the color filter substrate CF. Liquid crystal LC is sealed inside the peripheral sealant area. In addition, spacers, which are not illustrated in the drawing, are provided inside the peripheral sealant area. The spacers are provided for the purpose of adjusting a cell gap therebetween.

The array substrate AR has two short sides 11*a* and 11*b* opposite to each other as well as two long sides 11*c* and 11*d* opposite to each other. The protruding part 13 mentioned above is formed at an area extending along and close to the short side 11*b*. An integrated circuit (IC) chip Dr for source driving and gate driving is mounted at a chip mounting area CA, which is formed on the protruding part 13. A light detection unit LD is provided at an area extending along and close to the opposite short side 11*a*. The light detection unit LD, which is a photo-detection part, includes light sensors LS, which are made up of thin film transistors (TFTs). A backlight, which is not illustrated in the drawing, is provided at the rear of the array substrate AR. The backlight described herein functions as an illumination unit, which emits light. An external controlling unit, which is not illustrated in the drawing, controls the illuminating operation of the backlight on the basis of the output of the light detection unit LD.

A plurality of scanning lines GW, which are gate wiring, and a plurality of signal lines SW, which are source wiring, are formed over one surface of the array substrate AR that faces the color filter substrate CF. That is, the plurality of scanning lines GW and the plurality of signal lines SW are formed over a surface thereof that contacts the liquid crystal LC. The scanning lines GW are arrayed adjacent to one another with a certain line pitch (i.e., a predetermined interval between two adjacent lines) in such a manner that each of the scanning lines GW extends in the horizontal direction shown in FIG. 1. The horizontal direction of FIG. 1 in which each of the scanning lines GW extends is defined as "row direction". The signal lines SW are arrayed adjacent to one another with a certain line pitch in such a manner that each of signal lines SW extends in the vertical direction shown in FIG. 1. The vertical direction of FIG. 1 in which each of the signal lines SW extends is defined as "column direction". The scanning lines GW and the signal lines SW are insulated from each other. In a plan view, these signal lines SW and scanning lines GW are patterned in a matrix layout. A switching element and a pixel electrode are formed at each area that is surrounded by the scanning lines GW and the signal lines SW that intersect with each other. The switching element turns ON upon the reception of a scanning signal through the scanning line GW. A video signal is supplied from the signal line SW via the switching element to the pixel electrode. In FIG. 2, the scanning lines GW, the signal line SW, the switching elements, and the pixel electrodes are correctively shown as a first structure 15.

Each area surrounded by the scanning lines GW and the signal lines SW constitutes a display pixel. An area at which the plurality of display pixels is arrayed forms a display area DA. For example, a TFT is used as the switching element. Each of the scanning lines GW and the signal lines SW extends outward to a picture frame area that is located outside the display area DA. At the picture frame area, the scanning lines GW and the signal lines SW are connected to gate routing lines GL and source routing lines SL, respectively. The gate routing lines GL and the source routing lines SL are routed in a peripheral area outside the display area DA. In addition, a common line COM is patterned outside the gate routing lines GL. The common line COM surrounds the display area DA. The ends of the plurality of gate routing lines GL and the plurality of source routing lines SL are connected to the IC chip Dr. The ends of the common line COM are also connected to the IC chip Dr.

Light sensor routing lines L1, L2, and L3 extend along one long side 11*c* of the array substrate AR from the light sensors LS, which are made up of the TFTs of the light detection unit LD. Each of the light sensor routing lines L1, L2, and L3, which is connected to the light detection unit LD at one end, is connected to the corresponding one of terminals at the other end. The terminals are hereafter denoted as T1, T2, and T3. An external controlling circuit is connected to each of the first terminal T1, the second terminal T2, and the third terminal T3. The external controlling circuit supplies a reference voltage and the like to the light detection unit LD. Note that the external controlling circuit is not illustrated in the drawing. Output from the light detection unit LD is sent out thereto. A more detailed explanation of the configuration of the light detection unit LD will be given later.

A light-shielding layer is formed over one surface of the color filter substrate CF that faces the array substrate AR in such a manner that the light-shielding layer covers the scanning lines GW, the signal lines SW, the switching elements, and the picture frame area. That is, the light-shielding layer is formed over a surface thereof that contacts the liquid crystal LC. A color filter layer is formed at an area surrounded by the light-shielding layer in the display area DA. The color filter layer includes a plurality of color components such as, for example, three primary color components of red (R), green (G), and blue (B). A protective film that is made of a transparent material is formed so as to cover the color filter layer and the like. Elements inclusive of the layer/film explained above are correctively shown as a second structure 16 in FIG. 2. Each color component of the color filter layer explained above is provided in, for example, a stripe array pattern along the extending direction of the signal line SW of the array substrate AR.

As illustrated in FIG. 4, the light detection unit LD is provided with the plurality of light sensors LS. These light sensors LS are arrayed adjacent to one another in a parallel manner in a line. The light sensors LS are connected in parallel to one another so as to detect the average value of the amount of incident light that enters each light sensor LS. Next, the configuration of the light detection unit LD is explained below while referring to FIG. 3. In the configuration of the liquid crystal display device 10A according to the first embodiment of the invention, the light detection unit LD is provided with the light sensor LS made up of more than one TFT. However, in the following description made with reference to FIG. 3, the configuration of the light sensor LS including a single TFT is explained.

A capacitor C is connected in parallel in between the drain electrode Dp of the light sensor LS and the source electrode Sp thereof. The source electrode Sp of the light sensor LS as well as one terminal of the capacitor C is connected to the terminal T1 through the light sensor routing line L2. The terminal T1 is connected to a first reference voltage source Vs via a switching element S. In addition, an output voltage VA is outputted from the terminal T1. On the other hand, the drain electrode Dp of the light sensor LS as well as the other terminal of the capacitor C is connected to the terminal T2 through the light sensor routing line L1. The terminal T2 is connected to a second reference voltage source VREF, which supplies a predetermined direct-current voltage. Although the terminal T2 is connected to the second reference voltage source VREF in the illustrated configuration example, the terminal connection thereof is not limited to the specific example shown in FIG. 3. For example, the terminal T2 may be grounded. The gate electrode Gp of the light sensor LS is connected through the light sensor routing line L3 to a voltage source that supplies a predetermined voltage VG. The predetermined voltage VG is supplied so as to keep the light sensor LS in a gate-OFF state.

The light detection unit LD having the configuration explained above is operated as follows. A predetermined level of a reverse bias voltage VG for a gate OFF region is applied to the gate electrode Gp of the light sensor LS through the terminal T3 and the light sensor routing line L3. For example, a voltage of −10V is applied thereto as the reverse bias voltage VG. The first reference voltage source Vs is connected to the drain electrode Dp of the light sensor LS and one terminal of the capacitor C via the switching element S. The switching element S is turned ON so as to apply a predetermined voltage, for example, a voltage of +2V, to both terminals of the capacitor C. Thereafter, the switching element S is turned OFF. Then, the charging voltage of the capacitor C is measured at a detection circuit. Time taken for the charging voltage to become a predetermined voltage is measured. In this way, it is possible to detect the intensity of ambient light (i.e., environment light). As an example of such a detection circuit, a known sampling hold circuit that operates in synchronization with the ON/OFF state of the switching element S can be used for the conversion thereof into an analog output voltage; then, after the analog-to-digital (A/D) conversion of the analog output voltage by an A/D converter, the digital output voltage is subjected to digital arithmetic processing. By this means, it is possible to measure the intensity (i.e., brightness or luminance) of ambient light on the basis of a predetermined analytical curve. An external controlling circuit, which is not illustrated in the drawing, performs backlight control on the basis of the intensity of ambient light that is detected as explained above.

Next, various kinds of lines that are patterned in the chip mounting area CA are explained below while referring to FIGS. 1, 4, and 5. The routing ends of the plurality of gate routing lines GL, the plurality of source routing lines SL, and the common line COM are provided at one long side area part of the chip mounting area CA. Bump terminals GB, SB, and COMB (refer to FIG. 5) are formed respectively at the ends of the gate routing lines GL, the source routing lines SL, and the common line COM that are routed to the long side part of the chip mounting area CA. These bump terminals GB, SB, and COMB are provided for connection to the bump terminals of the IC chip Dr. Each of these bump terminals GB, SB, and COMB has an exposed surface. When the IC chip Dr is mounted at the chip mounting area CA, these bump terminals GB, SB, and COMB are electrically connected to the IC chip Dr with the use of, for example, an anisotropic conductive adhesive or the like.

Specifically, the signal line bump terminals SB are provided inside a signal line output pad area SA, which is located at the center region of one long side area part of the chip mounting area CA mentioned above. Each of the plurality of source routing lines SL is routed in such a manner that the end thereof is connected to the corresponding one of the signal line bump terminals SB. The scanning line bump terminals GB are provided inside scanning line output pad areas GA1 and GA2, each of which is located next to and at the outer area position as viewed from the corresponding short side of the signal line output pad area SA. Each of the plurality of gate routing lines GL is routed in such a manner that the end thereof is connected to the corresponding one of the scanning line bump terminals GB. The common line bump terminals COMB are provided inside common line pad areas COMA, each of which is located next to and at the outer area position as viewed from the corresponding one of the scanning line output pad areas GA1 and GA2. The common line COM is routed in such a manner that each end thereof is connected to the corresponding one of the common line bump terminals COMB. A lead line extends from each of the bump terminals GB, SB, and COMB that are formed respectively at the ends of the gate routing lines GL, the source routing lines SL, and the common line COM. A testing terminal is provided at the end of each of the lead lines. The testing terminals are arrayed with certain array regularity. In the following description, the array structure of the leading lines and the testing terminals is explained.

Source lead lines 40R, 40G, and 40B extend toward the inner area part of the chip mounting area CA from the signal line bump terminals SB that are formed at the ends of the plurality of source routing lines SL. A red testing terminal 41R is provided at the end of each of the red source lead lines 40R. A green testing terminal 41G is provided at the end of each of the green source lead lines 40G. A blue testing terminal 41B is provided at the end of each of the blue source lead lines 40B. The lengths of the source lead lines 40R, 40G, and 40B are different from one another. Specifically, the source lead line 40R that is connected through the source routing line SL to the signal line SW that supplies a signal to pixels that display red (R) in the display area DA is the shortest among the source lead lines of three color components 40R, 40G, 40B. The red testing terminals 41R that are respectively connected to the source lead lines 40R are arrayed at a red testing terminal array area Sr. The source lead line 40B that is connected through the source routing line SL to the signal line SW that supplies a signal to pixels that display blue (B) in the display area DA is the longest among the source lead lines of three color components 40R, 40G, 40B. The blue testing terminals 41B that are respectively connected to the source lead lines 40B are arrayed at a blue testing terminal array area Sb. The source lead line 40G that is connected through the source routing line SL to the signal line SW that supplies a signal to pixels that display green (G) in the display area DA is longer than the source lead line 40R but shorter than the source lead line 40B. The green testing terminals 41G that are respectively connected to the source lead lines 40G are arrayed at a green testing terminal array area Sg.

Since the lengths of the source lead lines 40R, 40G, and 40B are different from one another as explained above, the red testing terminals 41R, the green testing terminals 41G, and the blue testing terminals 41B are arrayed in three line areas separately. That is, the red testing terminals 41R are aligned in the red testing terminal array area Sr. The green testing terminals 41G are aligned in the green testing terminal array area Sg. The blue testing terminals 41B are aligned in the blue testing terminal array area Sb. Accordingly, the testing terminals of each color component connected indirectly to the signal lines SW that supply signals to pixels that display the same corresponding color are arrayed in the testing terminal array area of the corresponding color.

Gate lead lines 45P1 and 45P2 extend toward the inner area part of the chip mounting area CA from the scanning line bump terminals GB that are formed at the ends of the plurality of gate routing lines GL. Specifically, the gate lead lines 45P1 and 45P2 extend toward inner areas each of which is located, if roughly explained, next to and at the outer area position as viewed from the corresponding short side of the red testing terminal array area Sr, the green testing terminal array area Sg, and blue testing terminal array area Sb. Gate testing terminals 46P1, 46P2 are formed at the ends of the gate lead lines 45P1, 45P2. The plurality of gate lead lines 45P1, 45P2 have different lengths. Specifically, the gate lead lines connected through the gate routing line GL to odd-numbered scanning lines GW are shorter than the other gate lead lines. In other words, the gate lead lines connected through the gate routing line GL to even-numbered scanning lines GW are longer than the other gate lead lines.

Since the lengths of the gate lead lines 45P1, 45P2 are different as explained above, the gate testing terminals 46P1, 46P2 that are connected to the gate lead lines 45P1, 45P2 are each arrayed in two line areas in an “odd-even staggered” manner. That is, the gate testing terminals 46P1, 46P2 are arrayed in four scanning-line testing terminal array areas G1*a*, G1*b*, G2*a*, and G2*b* in total. With such quartered array of the gate testing terminals 46P1, 46P2, it is possible to conduct a test with the plurality of scanning lines GW being divided into four groups. These four groups of the scanning lines GW described herein correspond to a first scanning line group, a second scanning line group, a third scanning line group, and a fourth scanning line group according to an aspect of the invention. If it is not necessary to conduct a test with the plurality of scanning lines GW being divided into four groups, it may be performed in a single batch test. However, it is preferable to conduct a test with the plurality of scanning lines GW being divided into at least two groups for the fine testing of a display area.

A common lead line 50 extends toward the inner area part of the chip mounting area CA from each common line bump terminal COMB that is formed in the corresponding common line pad area COMA. A common testing terminal 51 is provided at the end of each common lead line 50 in a common testing terminal area "com". The common testing terminals 51 can be provided at any arbitrary positions as long as the terminals 51 do not obstruct the testing of other terminals. In the configuration of the liquid crystal display device 10A according to the first embodiment of the invention, two common testing terminals 51 are provided each at the end of the common lead line 50 near the corresponding long side of the array substrate AR.

In addition to the components explained above, in the configuration of the liquid crystal display device 10A according to the first embodiment of the invention, an electrostatic discharge (ESD) protection thin film transistor PT is provided each between the first routing line L1 of the light detection unit LD and the common line COM and between the second routing line L2 of the light detection unit LD and the common line COM as illustrated in FIGS. 4 and 5. The electrostatic discharge protection TFT PT is provided for protecting optical sensors. The controlling electrode (gate electrode) of the electrostatic discharge protection TFT PT is connected to a terminal T4 through a fourth routing line L4. A voltage VGOFF that switches the electrostatic discharge protection TFT PT between an ON state and an OFF state is applied to the terminal T4. A voltage that sets the electrostatic discharge protection TFT PT in an OFF state is applied thereto at the time of normal image display.

In the configuration of the liquid crystal display device 10A according to the first embodiment of the invention, further in addition to the components explained above, light sensor testing terminals 31, 32, 33, and 34 are provided for three routing lines L1, L2, and L3 that extend from the light detection unit LD and the routing line L4 of the light-sensor ESD protection TFT PT. These light sensor testing terminals 31, 32, 33, and 34 are provided for conducting an intermediate function test of the light sensors LS. The light sensor testing terminal 31 that is connected to the routing line L1 is provided adjacent to the green testing terminal 41G that is provided in the green testing terminal array area Sg. The light sensor testing terminal 32 that is connected to the routing line L2 is provided adjacent to the red testing terminal 41R that is provided in the red testing terminal array area Sr. The light sensor testing terminal 33 that is connected to the routing line L3 is provided "adjacent" to one common testing terminal 51. The light sensor testing terminal 34 that is connected to the routing line L4 is provided adjacent to the other common testing terminal 51.

As explained above, each of the plurality of light sensor testing terminals 31, 32, 33, and 34 is provided at a "same-line" position, for example, on an extended array line of testing terminals of other wiring among testing terminals of other wiring that are provided at different array areas. With such a terminal layout, it is possible to perform probe-contacting work with the use of a testing tool 70 (refer to FIG. 6) in a single non-separate process in an intermediate function test, which will be explained later. In the following description, the structure of the testing tool 70 that is used in the in-process function inspection of the liquid crystal display device 10A having the configuration explained above is explained. In addition, a testing method thereof is also explained below. Note that FIG. 6 shows, in addition to the components of the testing tool 70, the reference signs of area parts of the chip mounting area CA so as to facilitate the understanding of the correspondence between the conductive material components of the testing tool 70 and the area parts of the chip mounting area CA.

The testing tool 70 that is used for conducting an intermediate function test of the liquid crystal display device 10A according to the first embodiment of the invention includes an insulating rubber base substance 74 and a plurality of conductive material members. The conductive material members are provided on the surface of the insulating rubber 74. A predetermined voltage is applied to each testing terminal via the conductive material so as to conduct an intermediate function test. The conductive material is made up of source contact members 71R, 71G, 71B, gate contact members 72P1 and 72P2, and a common contact member 73.

The source contact members 71R, 71G, 71B are configured as a parallel array of three elongated conductive bodies with a predetermined gap each therebetween. The positions of these three source contact members 71R, 71G, 71B are determined (i.e., adjusted) in such a manner that the source contact member 71R is brought into contact with the red testing terminal array area Sr at which the source testing terminals 41R illustrated in FIG. 5 are arrayed, the source contact member 71G is brought into contact with the green testing terminal array area Sg at which the source testing terminals 41G illustrated in FIG. 5 are arrayed, and the source contact member 71B is brought into contact with the blue testing terminal array area Sb at which the source testing terminals 41B illustrated in FIG. 5 are arrayed. In addition, the length of each of these source contact members 71R, 71G, 71B as viewed in the long-side direction thereof is determined in such a manner that they cover the light sensor testing terminal 31 and the light sensor testing terminal 32 in addition to the color component terminals so as to correspond to the signal line output pad area SA.

The gate contact members 72P1 and 72P2 are configured as a pair of elongated conductive bodies arrayed in parallel with each other with a predetermined gap therebetween in the neighborhood of each short side of an array of the source contact members 71R, 71G, 71B. Therefore, four elongated conductive bodies are provided as the gate contact members 72P1 and 72P2. The positions of these four elongated conductive bodies 72P1 and 72P2 are determined in such a manner that the gate contact member 72P1 is brought into contact with the scanning-line testing terminal array areas G1*a* and G2*a* at which the odd-numbered gate testing terminals illustrated in FIG. 5 are arrayed whereas the gate contact member 72P2 is brought into contact with the scanning-line testing terminal array areas G1*b* and G2*b* at which the even-numbered gate testing terminals illustrated in FIG. 5 are arrayed. The common contact member 73 is configured as separate rectangular conductive bodies each of which is provided outside the outer short side of a pair of the gate contact members 72P1, 72P2. The position of the common contact member 73 and the length thereof are determined in such a manner that it is brought into contact with one common testing terminal 51 and the light sensor testing terminal 33 at one side and is brought into contact with the other common testing terminal 51 and the light sensor testing terminal 34 at the other side.

In the following description, an intermediate function test of the liquid crystal display device 10A according to the first embodiment of the invention that is conducted with the use of the testing tool 70 that has the structure described above is explained. The intermediate function test is conducted immediately before the mounting of the IC chip Dr at the chip mounting area CA. As a first step, the relative position of the array substrate AR and the color filter substrate CF with line/wiring, members, and the like being formed thereon is adjusted so as to face each other. Then, after the bonding of the array substrate AR and the color filter substrate CF placed opposite to each other, the liquid crystal LC is sealed between the array substrate AR and the color filter substrate CF. Next, the testing tool 70 is placed at the chip mounting area CA. Specifically, the testing tool 70 is placed in the chip mounting area CA at such a position that each conductive material member of the testing tool 70 is brought into contact with the testing terminals of the corresponding testing area in the chip mounting area CA. Then, a predetermined voltage is applied to the testing terminals via each conductive material of the testing tool 70 so as to conduct a line/wiring inspection of the scanning lines GW, the signal lines SW, the common line COM, and the light sensors LS.

As explained above, with the features of the liquid crystal display device 10A according to the first embodiment of the invention, it is possible to conduct the testing of the light sensor LS concurrently with lighting inspection free from any short circuit between each electrode of the light sensor LS and the common line COM because (1) the light sensor testing terminal 32 that is connected to the routing line L2 and the terminal T1 is provided in the red testing terminal area Sr, (2) the light sensor testing terminal 31 that is connected to the routing line L1 and the terminal T2 is provided in the green testing terminal area Sg, and (3) when a voltage that is applied to the common testing terminal 51 provided in the common testing terminal area com is set at a gate-OFF voltage level, the electrostatic discharge protection TFT PT and the light sensor LS made up of TFTs are always set in an OFF state.

That is, the liquid crystal display device 10A according to the first embodiment of the invention makes it possible to conduct the following tests by setting the electrostatic discharge protection TFT PT and the light sensor LS made up of TFTs always in an OFF state and by changing a voltage that is applied to each testing terminal in various manners: (1) test on a short circuit between any of the scanning-line testing terminal groups G1*a*, G1*b*, G2*a*, and G2*b* and other terminals, (2) test on a short circuit between any of the terminals provided in the testing terminal areas Sr, Sb, and Sg and other terminals, (3) lighting test, and (4) short circuit test of the light sensor LS. In addition, if the value of an electric current that flows in the light sensor LS at the time of the short circuit test of the light sensor LS is measured, it is possible to detect not only low resistance short circuit but also high resistance short circuit on the basis of the measured current value.

As explained above, the liquid crystal display device 10A according to the first embodiment of the invention makes it possible to conduct an intermediate function test of the light detection unit LD at the time of an ordinary intermediate function test merely by changing a voltage that is supplied to each contact member without any need for the replacement of the testing tool 70 or the changing of the placement position thereof. Therefore, it is possible to simplify the processes of an intermediate function test. In addition, it is possible to eliminate any wasteful mounting of the IC chip Dr, which is expensive, because a function test inclusive of an inspection on the light detection unit LD is conducted before the mounting of such an expensive IC chip Dr at the chip mounting area CA.

Second Embodiment

The liquid crystal display device 10A according to the foregoing first embodiment of the invention makes it possible to detect the high resistance short circuit of the light sensor LS together with the lighting inspection of a display area. However, since (1) the light sensor testing terminal 32 that is connected to the routing line L2 and the terminal T1 is provided in the red testing terminal area Sr and (2) the light sensor testing terminal 31 that is connected to the routing line L1 and the terminal T2 is provided in the green testing terminal area Sg, the liquid crystal display device 10A according to the foregoing first embodiment of the invention does not make it possible to conduct a test on a short circuit between the gate electrode Gp of the light sensor LS and the common line COM. Nor does the liquid crystal display device 10A according to the foregoing first embodiment of the invention make it possible to conduct a test on a short circuit between the gate electrode of the electrostatic discharge protection TFT PT, which is provided for protecting the light sensor LS, and the common line COM.

The configuration of a liquid crystal display device 10B according to a second embodiment of the invention that makes it possible to conduct a test on a short circuit between the gate electrode Gp of the light sensor LS and the common line COM as well as a test on a short circuit between the gate electrode of the electrostatic discharge protection TFT PT and the common line COM is explained below with reference to FIGS. 7 and 8. In the following description of the configuration of the liquid crystal display device 10B according to the second embodiment of the invention, the same reference numerals are consistently used for the same components as those of the liquid crystal display device 10A according to the first embodiment of the invention so as to omit, if appropriate, any redundant explanation or simplify explanation thereof. The liquid crystal display device 10B according to the second embodiment of the invention has the following differences in configuration from the liquid crystal display device 10A according to the first embodiment of the invention. (1) A TFT 55*a*, which functions as a switching element, is provided between the third routing line L3 and the third terminal T3. A TFT 55*b*, which functions as a switching element, is provided between the fourth routing line L4 and the fourth terminal T4. (2) The gate electrode of the TFT 55*a* is connected to a terminal 56*a* that is provided in the scanning-line testing terminal array area G1*b* and a terminal 56*b* that is provided in the scanning line output pad area GA1. The gate electrode of the TFT 55*b* is connected to a terminal 56*c* that is provided in the scanning-line testing terminal array area G2*b* and a terminal 56*d* that is provided in the scanning line output pad area GA2. (3) The light sensor testing terminal 33 that is formed in the scanning-line testing terminal array area G1*a* is provided between the TFT 55*a* and the third terminal T3. The light sensor testing terminal 34 that is formed in the scanning-line testing terminal array area G2*a* is provided between the TFT 55*b* and the fourth terminal T4.

With the configuration of the liquid crystal display device 10B according to the second embodiment of the invention, it is possible to conduct a test on a short circuit between the gate electrode Gp of the light sensor LS and the common line COM as well as a test on a short circuit between the gate electrode of the electrostatic discharge protection TFT PT, which is provided for protecting the light sensor LS, and the common line COM independently. Moreover, for example, if a voltage of −10V is applied to the scanning-line testing terminal array area G1*b* when a voltage of 15V is applied to the scanning-line testing terminal array area G1*a*, the TFT 55*a* is set in an OFF state, which results in a floating state between the scanning-line testing terminal array area G1*a* and the common line COM. Therefore, it is possible to conduct a test in the same manner as done by the liquid crystal display device 10A according to the first embodiment of the invention.

Third Embodiment

The configuration of a liquid crystal display device 10C according to a third embodiment of the invention that makes it possible to, as another embodiment, conduct a test on a short circuit between the gate electrode Gp of the light sensor LS and the common line COM as well as a test on a short circuit between the gate electrode of the electrostatic discharge protection TFT PT and the common line COM is explained below with reference to FIGS. 9 and 10. In the following description of the configuration of the liquid crystal display device 10C according to the third embodiment of the invention, the same reference numerals are consistently used for the same components as those of the liquid crystal display device 10A according to the first embodiment of the invention so as to omit, if appropriate, any redundant explanation or simplify explanation thereof. The liquid crystal display device 10C according to the third embodiment of the invention has the following differences in configuration from the liquid crystal display device 10A according to the first embodiment of the invention. (1) Thin film transistors 55*a* and 55*a*', each of which functions as a switching element, are provided between the third routing line L3 and the third terminal T3. Thin film transistors 55*b* and 55*b*', each of which functions as a switching element, are provided between the fourth routing line L4 and the fourth terminal T4. (2) The gate electrode of the TFT 55*a* is connected to a terminal 56*a* that is provided in the scanning-line testing terminal array area G1*b* and a terminal 56*b* that is provided in the scanning line output pad area GA1. In addition, the gate electrode of the TFT 55*a* is connected to the gate electrode of the TFT 55*b*'. The gate electrode of the TFT 55*a*' is connected to a terminal 56*c* that is provided in the scanning-line testing terminal array area G2*a* and a terminal 56*d* that is provided in the scanning line output pad area GA2. (3) The gate electrode of the TFT 55*b* is connected to the terminal 56*c* that is provided in the scanning-line testing terminal array area G2*a* and the terminal 56*d* that is provided in the scanning line output pad area GA2. (4) An electrode of the TFT 55*a* is connected to a terminal 56*e* that is provided in the scanning-line testing terminal array area G1*a*. An electrode of the TFT 55*b* is connected to a terminal 56*f* that is provided in the scanning-line testing terminal array area G2*b*.

With the configuration of the liquid crystal display device 10C according to the third embodiment of the invention, it is possible to conduct a test on a short circuit between the gate electrode Gp of the light sensor LS and the common line COM as well as a test on a short circuit between the gate electrode of the electrostatic discharge protection TFT PT, which is provided for protecting the light sensor LS, and the common line COM independently. Moreover, if all of the TFTs each functioning as a switching element are set in an OFF state at the time of panel lighting, it is possible to set a floating state between the scanning-line testing terminal array area G1*a* and the common line COM. Therefore, it is possible to conduct a test in the same manner as done by the liquid crystal display device 10A according to the first embodiment of the invention.

It is explained above that each of the liquid crystal display device 10A according to the first embodiment of the invention, the liquid crystal display device 10B according to the second embodiment of the invention, and the liquid crystal display device 10C according to the third embodiment of the invention is driven in a TN mode or a VA mode. However, the scope of this aspect of the invention is not limited to a TN-mode or a VA-mode liquid crystal display device. For example, the concept of the invention can be applied to a liquid crystal display device that is driven in an IPS (In-Plane Switching) mode or an FFS (Fringe Field Switching) mode. In the configuration of an IPS-mode or an FFS-mode liquid crystal display device, both of pixel electrodes and a common electrode are formed over the array substrate AR. Furthermore, the invention is applicable not only to a liquid crystal display device but also to various kinds of active matrix display devices. For example, the invention is applicable to a variety of well-known display devices such as an organic electroluminescence (EL) display device, a plasma display device, and the like.

The entire disclosure of Japanese Patent Application No. 2008-216271, filed Aug. 26, 2008 is expressly incorporated by reference herein.

What is claimed is:

1. A display device comprising:

a substrate;

a plurality of signal lines and a plurality of scanning lines that intersect with each other over the substrate;

a common line that is provided over the substrate;

a plurality of display pixels that is arrayed in a matrix layout over the substrate, each of the plurality of display pixels including a thin film transistor and a pixel electrode, the thin film transistor being provided in the neighborhood of an intersection of the signal line and the scanning line, the thin film transistor functioning as a switching element, the pixel electrode being electrically connected to the thin film transistor;

a light sensor element that is provided over the substrate, the light sensor element being made of a thin film transistor that detects the amount of light;

an electrostatic protection element that is provided over the substrate, the electrostatic protection element being made of a thin film transistor that protects the light sensor element so that the light sensor element is not damaged by static electricity;

a plurality of testing terminals that is connected to the plurality of signal lines, the plurality of scanning lines, and the common line at a lead part that leads from the plurality of signal lines, the plurality of scanning lines, and the common line;

two light sensor element signal lines that respectively extend from a first electrode of the light sensor element and a second electrode of the light sensor element to the lead part, one light sensor element signal line being connected to a testing terminal other than the plurality of testing terminals, the other light sensor element signal line being connected to another testing terminal other than the plurality of testing terminals;

a light sensor element control line that extends from a control electrode of the light sensor element to the lead part, the light sensor element control line being connected to still another testing terminal other than the plurality of testing terminals; and an electrostatic protection element control line that extends from a control electrode of the electrostatic protection element to the lead part, the electrostatic protection element control line being connected to still another testing terminal other than the plurality of testing terminals, wherein the testing terminals of the light sensor element signal lines are arrayed adjacent to two testing terminals of the plurality of signal lines, respectively, and the testing terminal of the common line, the testing terminal of the light sensor element control line, and the testing terminal of the electrostatic protection element control line are arrayed in an adjacent manner.

2. The display device according to claim 1, wherein the plurality of signal lines is arrayed in a predetermined sequential order so as to be capable of displaying different colors;

the testing terminals of the plurality of signal lines are separately arrayed so as to form a plurality of array lines each of which corresponds to a color among the different colors of the plurality of signal lines;

the testing terminals of the light sensor element signal lines that respectively extend from the first electrode of the light sensor element and the second electrode of the light sensor element are provided on two array lines different from each other in such a manner that each of the testing terminals of the light sensor element signal lines lies on an extension of one of the plurality of array lines; and the testing terminal of the common line, the testing terminal of the light sensor element control line, and the testing terminal of the electrostatic protection element control line are arrayed on the same line.

3. A test probe for testing the display device according to claim 2, the test probe comprising:

a scanning-line wiring part that extends in a direction intersecting with the leading direction of the lead part formed over the substrate, the scanning-line wiring part extending so as to correspond to the array layout of the testing terminals of the plurality of scanning lines, the scanning-line wiring part being brought into contact with the testing terminals of the plurality of scanning lines when the test probe is brought into contact with the testing terminals of the display device;

a first signal-line wiring part that extends in the direction intersecting with the leading direction of the lead part formed over the substrate, the first signal-line wiring part extending so as to correspond to one of the plurality of array lines of the testing terminals of the plurality of signal lines and one of the testing terminals of the light sensor element signal lines, the first signal-line wiring part being brought into contact with the one of the plurality of array lines of the testing terminals of the plurality of signal lines and the one of the testing terminals of the light sensor element signal lines when the test probe is brought into contact with the testing terminals of the display device;

a second signal-line wiring part that extends in the direction intersecting with the leading direction of the lead part formed over the substrate, the second signal-line wiring part extending so as to correspond to another one of the plurality of array lines of the testing terminals of the plurality of signal lines and the other of the testing terminals of the light sensor element signal lines, the second signal-line wiring part being brought into contact with the another one of the plurality of array lines of the testing terminals of the plurality of signal lines and the other of the testing terminals of the light sensor element signal lines when the test probe is brought into contact with the testing terminals of the display device;

a third signal-line wiring part that extends in the direction intersecting with the leading direction of the lead part formed over the substrate, the third signal-line wiring part extending so as to correspond to the other or the others of the plurality of array lines of the testing terminals of the plurality of signal lines, the third signal-line wiring part being brought into contact with the other or the others of the plurality of array lines of the testing terminals of the plurality of signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

4. The display device according to claim 1, wherein the plurality of scanning lines is divided into four groups, which are a first scanning line group, a second scanning line group, a third scanning line group, and a fourth scanning line group;

the plurality of scanning lines extends to the lead part for each of the first scanning line group, the second scanning line group, the third scanning line group, and the fourth scanning line group; and the testing terminals connected respectively to the plurality of scanning lines are separately arrayed near one another so as to correspond to the first scanning line group, the second scanning line group, the third scanning line group, and the fourth scanning line group.

5. The display device according to claim 4, further comprising a first switching element and a second switching element each of which is provided in the lead part, wherein the light sensor element control line is connected to a first electrode of the first switching element;

the electrostatic protection element control line is connected to a first electrode of the second switching element;

a testing terminal is connected to a second electrode of the first switching element;

another testing terminal is connected to a second electrode of the second switching element;

still another testing terminal is connected to a control electrode of the first switching element;

still another testing terminal is connected to a control electrode of the second switching element;

the testing terminals of the light sensor element signal lines are arrayed adjacent to two testing terminals of the plurality of signal lines, respectively; and the testing terminals that are connected to the second electrodes of the first switching element and the second switching element and to the control electrodes of the first switching element and the second switching element are arrayed separately in such a manner that each of the testing terminals that are connected to the second electrodes of the first switching element and the second switching element and to the control electrodes of the first switching element and the second switching element is provided adjacent to an array of the testing terminals of the corresponding one of the first scanning line group, the second scanning line group, the third scanning line group, and the fourth scanning line group.

6. A test probe for testing the display device according to claim 5, the test probe comprising:

a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device;

a second scanning-line wiring part that extends in a direction intersecting with the leading direction of the lead part formed over the substrate, the second scanning-line wiring part extending so as to correspond to the array layout of the testing terminals of the second scanning line group and the testing terminal of the second electrode of the second switching element, the second scanning-line wiring part being brought into contact with the testing terminals of the second scanning line group and the testing terminal of the second electrode of the second switching element when the test probe is brought into contact with the testing terminals of the display device;

a third scanning-line wiring part that extends in a direction intersecting with the leading direction of the lead part formed over the substrate, the third scanning-line wiring part extending so as to correspond to the array layout of the testing terminals of the third scanning line group and the testing terminal of the control electrode of the first switching element, the third scanning-line wiring part being brought into contact with the testing terminals of the third scanning line group and the testing terminal of the control electrode of the first switching element when the test probe is brought into contact with the testing terminals of the display device;

a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the control electrode of the second switching element, the fourth scanning-line wiring part being brought into contact with the testing terminals of the fourth scanning line group and the testing terminal of the control electrode of the second switching element when the test probe is brought into contact with the testing terminals of the display device;

a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the common-line wiring part being brought into contact with the testing terminal of the common line when the test probe is brought into contact with the testing terminals of the display device.

7. The display device according to claim 4, further comprising a first switching element, a second switching element, a third switching element, and a fourth switching element each of which is provided in the lead part, wherein the light sensor element control line is connected to a first electrode of the first switching element and to a first electrode of the third switching element;

the electrostatic protection element control line is connected to a first electrode of the second switching element and to a first electrode of the fourth switching element;

a testing terminal is connected to a second electrode of the first switching element;

another testing terminal is connected to a second electrode of the second switching element;

still another testing terminal is connected to a second electrode of the third switching element;

still another testing terminal is connected to a second electrode of the fourth switching element;

shared testing terminals are connected to control electrodes of the first switching element, the second switching element, the third switching element, and the fourth switching element;

the testing terminals of the light sensor element signal lines are arrayed adjacent to two testing terminals of the plurality of signal lines, respectively;

any two terminals among the testing terminals that are connected to the second electrodes of the first switching element, the second switching element, the third switching element, and the fourth switching element are arrayed adjacent to the testing terminal of the common line; and the remaining two terminals among the testing terminals that are connected to the second electrodes of the first switching element, the second switching element, the third switching element, and the fourth switching element as well as the shared testing terminals that are connected to the control electrodes of the first switching element, the second switching element, the third switching element, and the fourth switching element are arrayed separately in such a manner that each one of the remaining two and shared terminals mentioned above is provided adjacent to an array of the testing terminals of the corresponding one of the first scanning line group, the second scanning line group, the third scanning line group, and the fourth scanning line group.

8. A test probe for testing the display device according to claim 7, the test probe comprising:

a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device;

a second scanning-line wiring part that extends in a direction intersecting with the leading direction of the lead part formed over the substrate, the second scanning-line wiring part extending so as to correspond to the array layout of the testing terminals of the second scanning line group as well as the testing terminal of the control electrode of the second switching element and the testing terminal of the control electrode of the third switching element, the second scanning-line wiring part being brought into contact with the testing terminals of the second scanning line group as well as the testing terminal of the control electrode of the second switching element and the testing terminal of the control electrode of the third switching element when the test probe is brought into contact with the testing terminals of the display device;

a third scanning-line wiring part that extends in a direction intersecting with the leading direction of the lead part formed over the substrate, the third scanning-line wiring part extending so as to correspond to the array layout of the testing terminals of the third scanning line group as well as the testing terminal of the control electrode of the first switching element and the testing terminal of the control electrode of the fourth switching element, the third scanning-line wiring part being brought into contact with the testing terminals of the third scanning line group as well as the testing terminal of the control electrode of the first switching element and the testing terminal of the control electrode of the fourth switching element when the test probe is brought into contact with the testing terminals of the display device;

a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the second electrode of the second switching element, the fourth scanning-line wiring part being brought into contact with the testing terminals of the fourth scanning line group and the testing terminal of the second electrode of the second switching element when the test probe is brought into contact with the testing terminals of the display device;

a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the second electrode of the third switching element, and the testing terminal of the second electrode of the fourth switching element, the common-line wiring part being brought into contact with the testing terminal of the common line, the testing terminal of the second electrode of the third switching element, and the testing terminal of the second electrode of the fourth switching element when the test probe is brought into contact with the testing terminals of the display device.

9. A test probe for testing the display device according to claim 4, the test probe comprising:

a scanning-line wiring part that extends in a direction intersecting with the leading direction of the lead part formed over the substrate, the scanning-line wiring part extending so as to correspond to the separate array layout of the testing terminals of the plurality of scanning lines divided into the first scanning line group, the second scanning line group, the third scanning line group, and the fourth scanning line group, the scanning-line wiring part being brought into contact with the testing terminals of the plurality of scanning lines divided into the first scanning line group, the second scanning line group, the third scanning line group, and the fourth scanning line group when the test probe is brought into contact with the testing terminals of the display device;

a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

10. A test probe for testing the display device according to claim 4, the test probe comprising:

a first scanning-line wiring part that extends in a direction intersecting with the leading direction of the lead part formed over the substrate, the first scanning-line wiring part extending so as to correspond to the array layout of the testing terminals of the first scanning line group and the testing terminal of the second electrode of the first switching element, the first scanning-line wiring part being brought into contact with the testing terminals of the first scanning line group and the testing terminal of the second electrode of the first switching element when the test probe is brought into contact with the testing terminals of the display device;

a second scanning-line wiring part that extends in a direction intersecting with the leading direction of the lead part formed over the substrate, the second scanning-line wiring part extending so as to correspond to the array layout of the testing terminals of the second scanning line group as well as the testing terminal of the control electrode of the second switching element and the testing terminal of the control electrode of the third switching element, the second scanning-line wiring part being brought into contact with the testing terminals of the second scanning line group as well as the testing terminal of the control electrode of the second switching element and the testing terminal of the control electrode of the third switching element when the test probe is brought into contact with the testing terminals of the display device;

a third scanning-line wiring part that extends in a direction intersecting with the leading direction of the lead part formed over the substrate, the third scanning-line wiring part extending so as to correspond to the array layout of the testing terminals of the third scanning line group as well as the testing terminal of the control electrode of the first switching element and the testing terminal of the control electrode of the fourth switching element, the third scanning-line wiring part being brought into contact with the testing terminals of the third scanning line group as well as the testing terminal of the control electrode of the first switching element and the testing terminal of the control electrode of the fourth switching element when the test probe is brought into contact with the testing terminals of the display device;

a fourth scanning-line wiring part that extends in a direction intersecting with the leading direction of the lead part formed over the substrate, the fourth scanning-line wiring part extending so as to correspond to the array layout of the testing terminals of the fourth scanning line group and the testing terminal of the second electrode of the second switching element, the fourth scanning-line wiring part being brought into contact with the testing terminals of the fourth scanning line group and the testing terminal of the second electrode of the second switching element when the test probe is brought into contact with the testing terminals of the display device;

a first signal-line wiring part that extends in the direction intersecting with the leading direction of the lead part formed over the substrate, the first signal-line wiring part extending so as to correspond to one of the plurality of array lines of the testing terminals of the plurality of signal lines and one of the testing terminals of the light sensor element signal lines, the first signal-line wiring part being brought into contact with the one of the plurality of array lines of the testing terminals of the plurality of signal lines and the one of the testing terminals of the light sensor element signal lines when the test probe is brought into contact with the testing terminals of the display device;

a second signal-line wiring part that extends in the direction intersecting with the leading direction of the lead part formed over the substrate, the second signal-line wiring part extending so as to correspond to another one of the plurality of array lines of the testing terminals of the plurality of signal lines and the other of the testing terminals of the light sensor element signal lines, the second signal-line wiring part being brought into contact with the another one of the plurality of array lines of the testing terminals of the plurality of signal lines and the other of the testing terminals of the light sensor element signal lines when the test probe is brought into contact with the testing terminals of the display device;

a third signal-line wiring part that extends in the direction intersecting with the leading direction of the lead part formed over the substrate, the third signal-line wiring part extending so as to correspond to the other or the others of the plurality of array lines of the testing terminals of the plurality of signal lines, the third signal-line wiring part being brought into contact with the other or the others of the plurality of array lines of the testing terminals of the plurality of signal lines when the test probe is brought into contact with the testing terminals of the display device; and a common-line wiring part that extends so as to correspond to the array layout of the testing terminal of the common line, the testing terminal of the second electrode of the third switching element, and the testing terminal of the second electrode of the fourth switching element, the common-line wiring part being brought into contact with the testing terminal of the common line, the testing terminal of the second electrode of the third switching element, and the testing terminal of the second electrode of the fourth switching element when the test probe is brought into contact with the testing terminals of the display device.

11. A test probe for testing the display device according to claim 1, the test probe comprising:

a scanning-line wiring part that extends in a direction intersecting with the leading direction of the lead part formed over the substrate, the scanning-line wiring part extending so as to correspond to the array layout of the testing terminals of the plurality of scanning lines, the scanning-line wiring part being brought into contact with the testing terminals of the plurality of scanning lines when the test probe is brought into contact with the testing terminals of the display device;

a signal-line wiring part that extends in the direction intersecting with the leading direction of the lead part formed over the substrate, the signal-line wiring part extending so as to correspond to the array layout of the testing terminals of the plurality of signal lines and the testing terminals of the light sensor element signal lines, the signal-line wiring part being brought into contact with the testing terminals of the plurality of signal lines and the testing terminals of the light sensor element signal lines when the test probe is brought into contact with the testing terminals of the display device; and a common-line wiring part that extends so as to correspond to the array layout of the testing terminal of the common line, the testing terminal of the light sensor element control line, and the testing terminal of the electrostatic protection element control line, the common-line wiring part being brought into contact with the testing terminal of the common line, the testing terminal of the light sensor element control line, and the testing terminal of the electrostatic protection element control line when the test probe is brought into contact with the testing terminals of the display device.

* * * * *